(12) United States Patent
Hata et al.

(10) Patent No.: US 7,356,919 B2
(45) Date of Patent: Apr. 15, 2008

(54) COMPONENT MOUNTING METHOD

(75) Inventors: Kanji Hata, Katano (JP); Noriaki Yoshida, Ikeda (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 45 days.

(21) Appl. No.: 11/429,063

(22) Filed: May 8, 2006

(65) Prior Publication Data

US 2006/0200975 A1    Sep. 14, 2006

Related U.S. Application Data

(60) Division of application No. 10/079,494, filed on Feb. 22, 2002, now Pat. No. 7,100,278, which is a continuation-in-part of application No. 09/010,490, filed on Jan. 21, 1998, now Pat. No. 6,789,310, which is a continuation of application No. 08/740,992, filed on Nov. 15, 1996, now Pat. No. 5,778,525.

(30) Foreign Application Priority Data

Nov. 6, 1995    (JP)    ................................... 7-286969

(51) Int. Cl.
*H05K 3/30* (2006.01)
(52) U.S. Cl. .............................. 29/833; 29/834; 29/832; 29/740
(58) Field of Classification Search .................. 29/714, 29/720, 739, 740, 743, 832–834, 836; 294/64.1; 414/737, 751.1, 752.1
See application file for complete search history.

(56) References Cited

U.S. PATENT DOCUMENTS

| | | | |
|---|---|---|---|
| 3,650,140 A | 3/1972 | Zmuda | |
| 4,231,153 A | 11/1980 | Browne | |
| 4,480,780 A | 11/1984 | Claeskens et al. | |
| 4,573,262 A | 3/1986 | Dornes et al. | |
| 4,624,050 A | 11/1986 | Hawkswell | |
| 4,631,812 A | 12/1986 | Young | |
| 4,872,258 A * | 10/1989 | Ragard | 29/740 |
| 4,875,285 A | 10/1989 | Haan et al. | |
| 5,002,448 A | 3/1991 | Kamijima et al. | |
| 5,115,559 A | 5/1992 | Oyama | |
| 5,153,983 A | 10/1992 | Oyama | |
| 5,191,702 A | 3/1993 | Goedecke et al. | |
| 5,233,745 A | 8/1993 | Morita | |
| 5,323,528 A | 6/1994 | Baker | |
| 5,410,801 A | 5/1995 | Shiloh et al. | |

(Continued)

FOREIGN PATENT DOCUMENTS

EP    0453369    10/1991

(Continued)

*Primary Examiner*—Donghai D. Nguyen
(74) *Attorney, Agent, or Firm*—Wenderoth, Lind & Ponack, L.L.P.

(57)    ABSTRACT

A component mounting apparatus has a pair of component supply sections, and first and second mounting head sections. Each of the first and second head sections has a rotary member driven about a horizontal axis, component suction nozzles attached to the rotary member, driving mechanisms for rotating corresponding component suction nozzles, and a recognition section for recognizing components sucked by the component suction nozzle. Each of the first and second mounting head sections performs successive suction, recognition, posture adjustment, and mounting of the components.

6 Claims, 31 Drawing Sheets

U.S. PATENT DOCUMENTS

| | | |
|---|---|---|
| 5,456,001 A | 10/1995 | Mori et al. |
| 5,541,834 A | 7/1996 | Tomigashi et al. |
| 5,579,572 A | 12/1996 | Kashiwagi et al. |
| 5,651,176 A | 7/1997 | Ma et al. |
| 5,692,292 A | 12/1997 | Asai et al. |
| 5,711,065 A | 1/1998 | Asai et al. |
| 5,740,604 A | 4/1998 | Kitamura et al. |
| 5,741,114 A | 4/1998 | Onodera |
| 5,743,001 A | 4/1998 | Baker et al. |
| 5,743,005 A | 4/1998 | Nakao et al. |

FOREIGN PATENT DOCUMENTS

| | | |
|---|---|---|
| JP | 54-043381 | 4/1979 |
| JP | 60-7200 | 1/1985 |
| JP | 63-178596 | 7/1988 |
| JP | 1-187898 | 7/1989 |
| JP | 2-54999 | 2/1990 |
| JP | 3-30499 | 2/1991 |
| JP | 03-131100 | 6/1991 |
| JP | 03-203294 | 9/1991 |
| JP | 06-077693 | 3/1994 |
| JP | 61-39000 | 5/1994 |
| JP | 07-22787 | 1/1995 |
| JP | 07-136875 | 5/1995 |
| JP | 9-130084 | 5/1997 |
| SU | 1829131 | 5/1991 |
| WO | 85/03404 | 8/1985 |

* cited by examiner

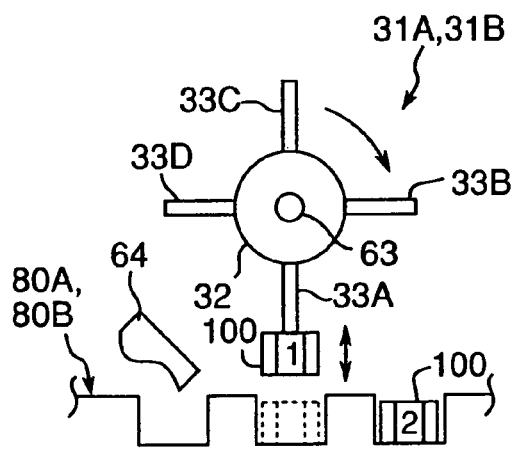
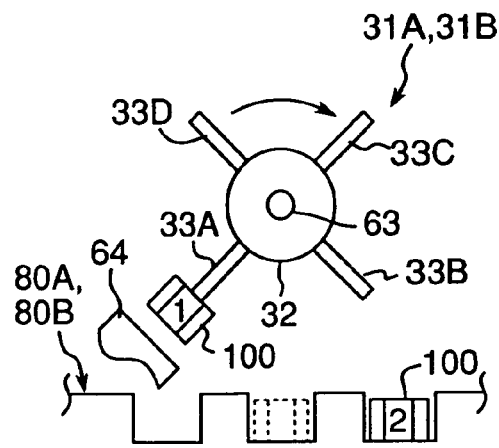
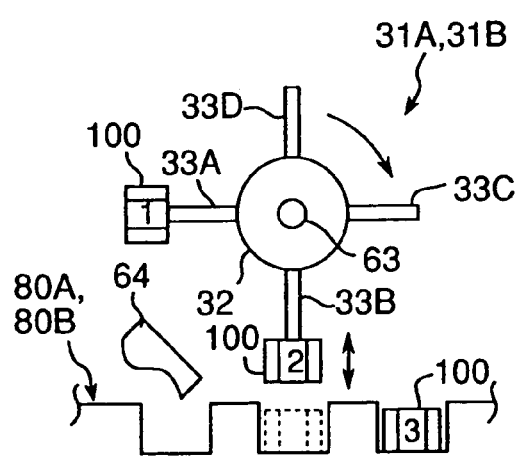
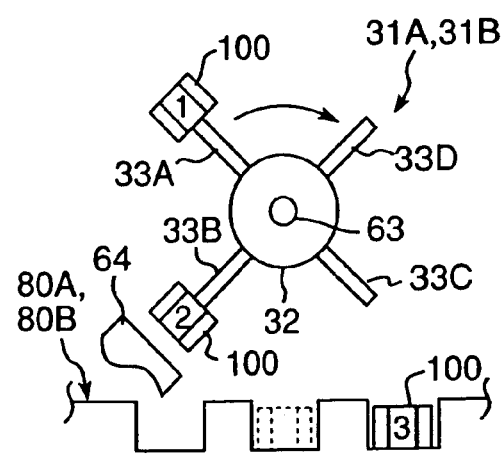

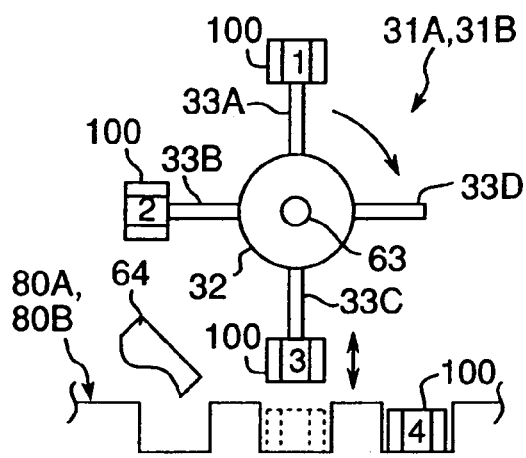
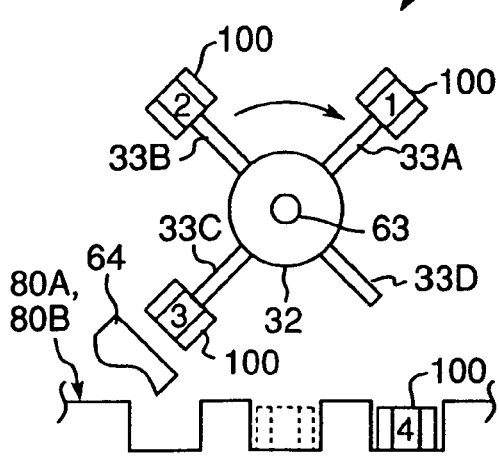
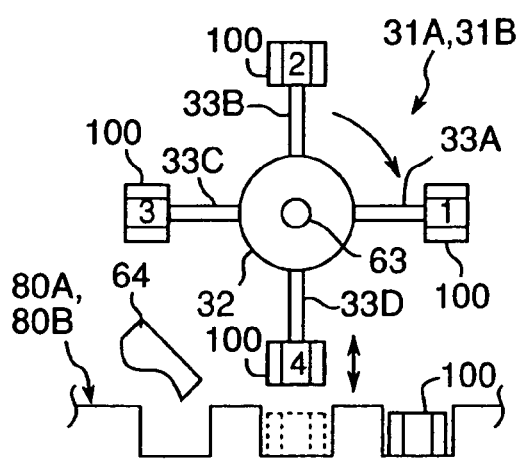
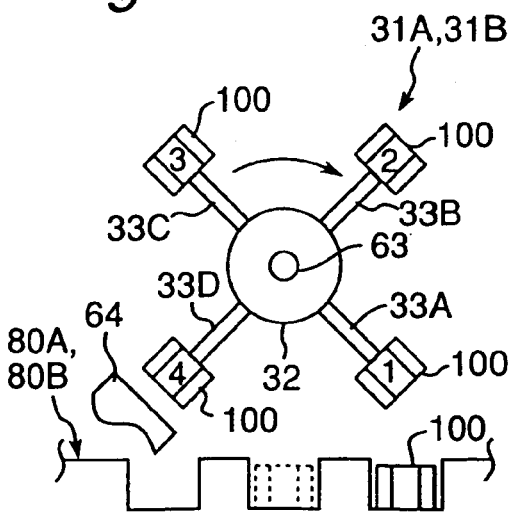

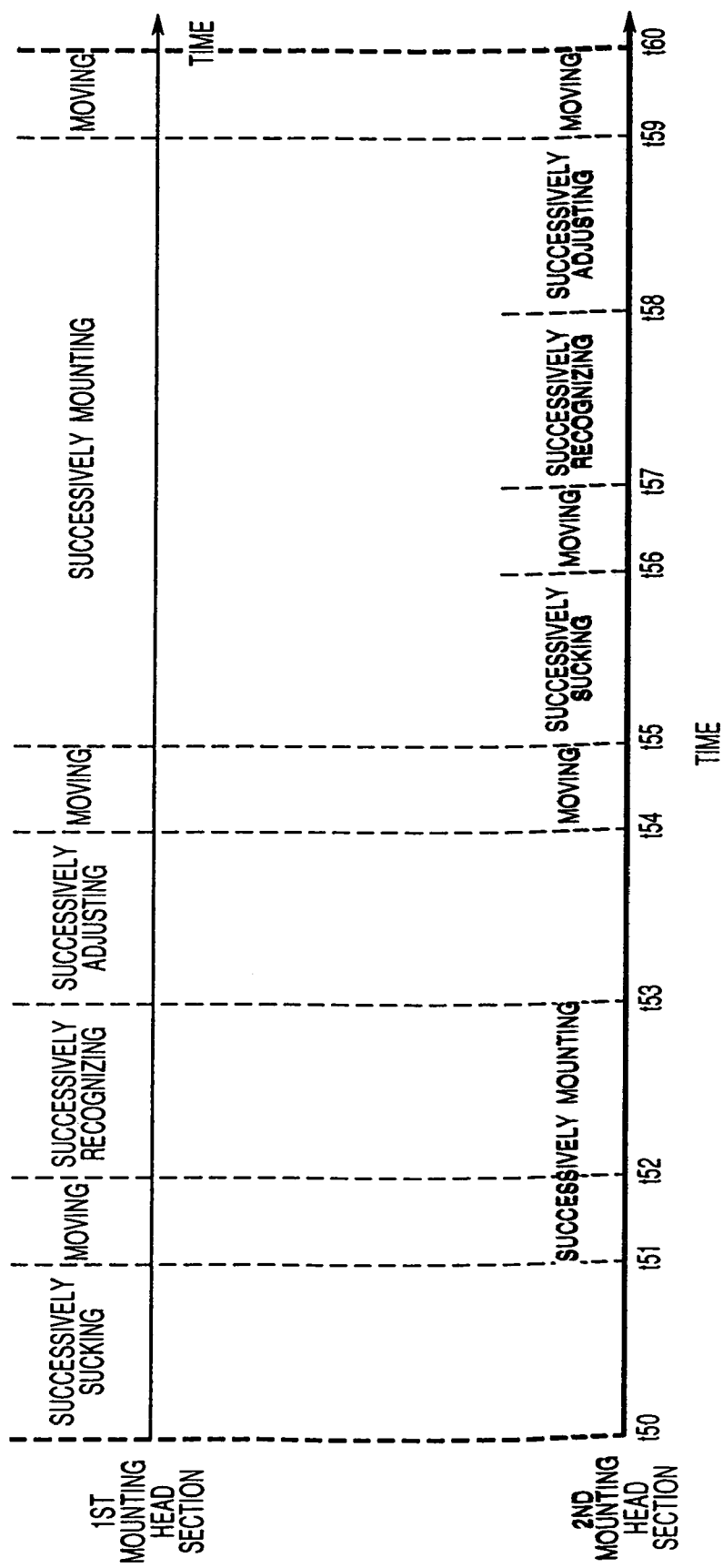

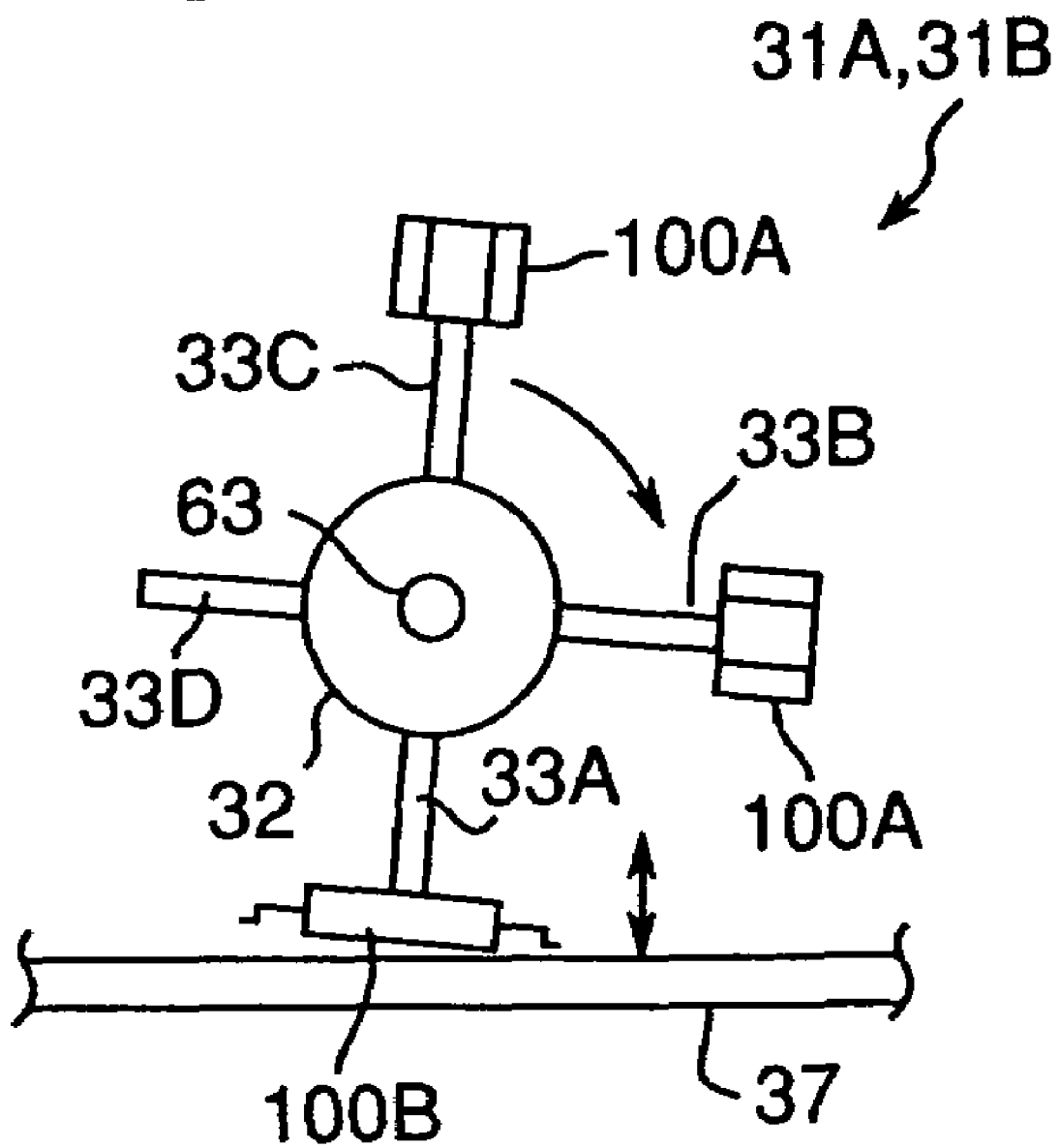

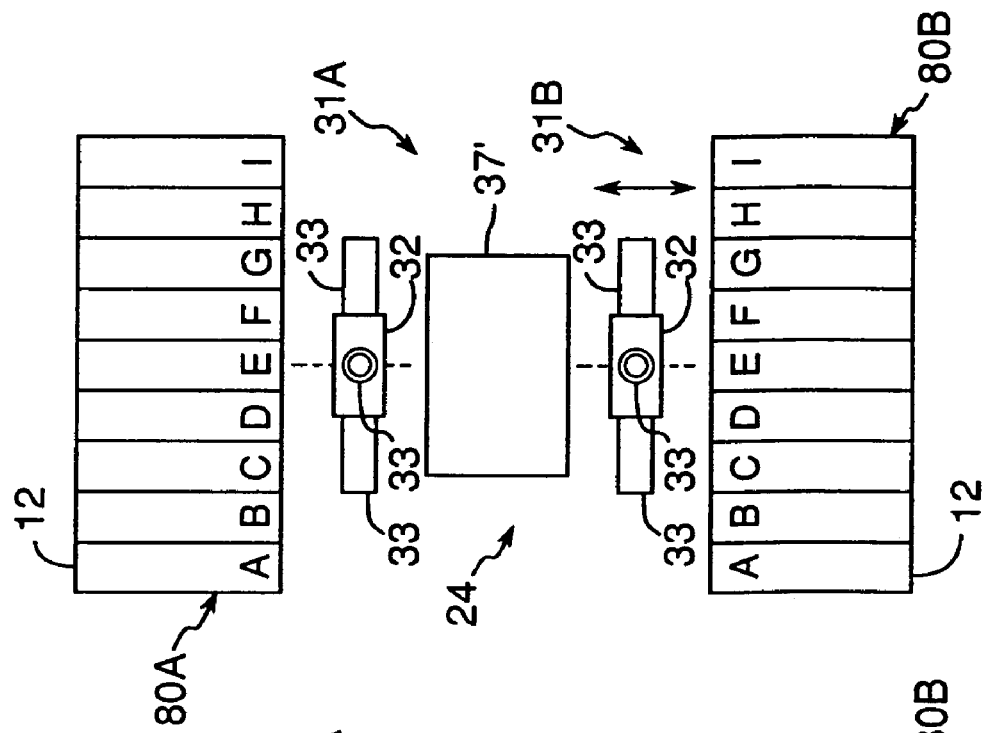
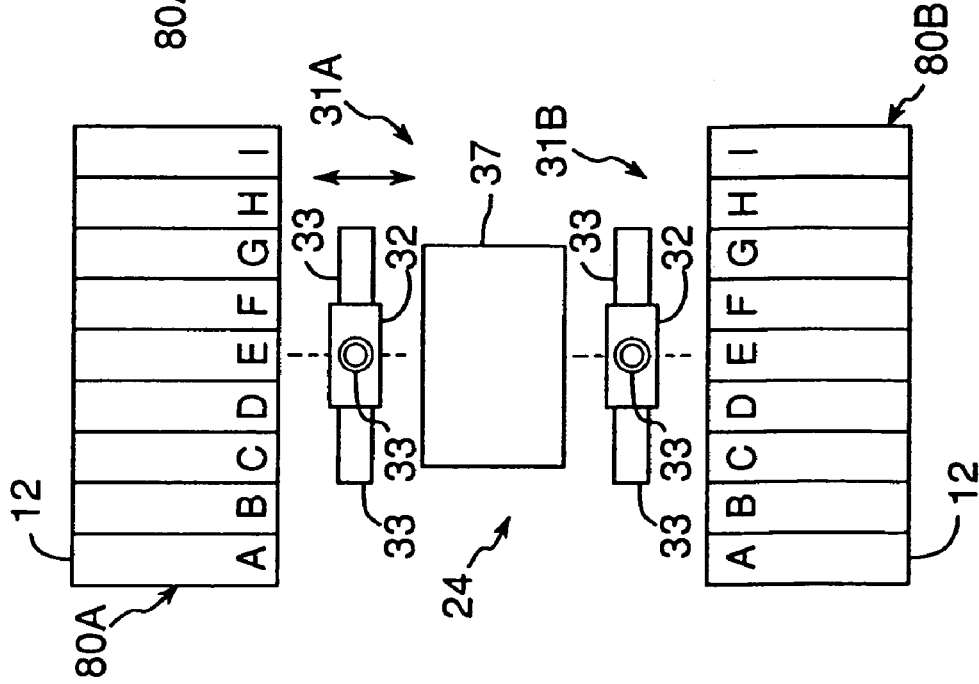

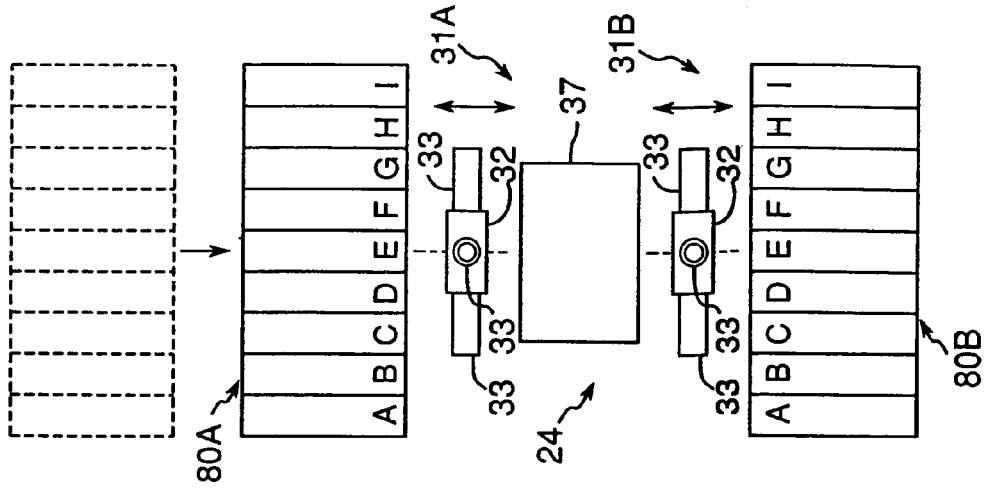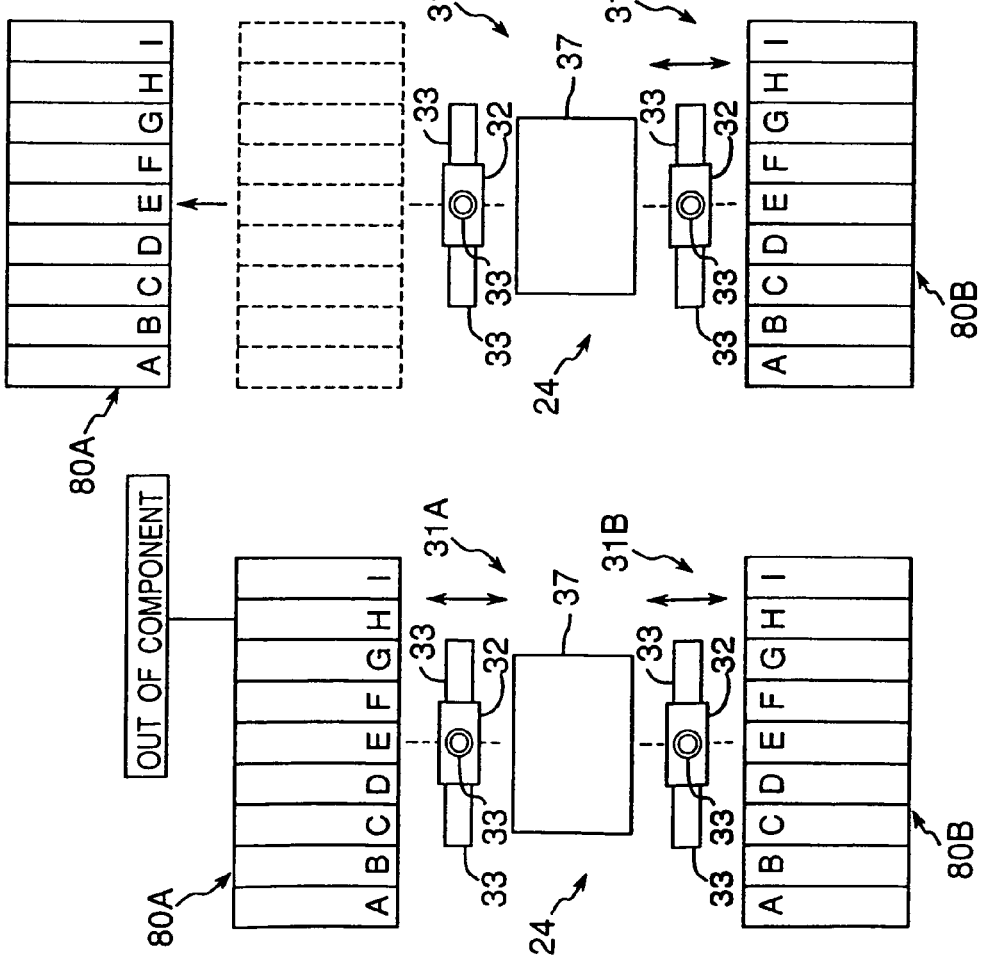

COMPONENT MOUNTING METHOD

CROSS REFERENCE OF RELATING APPLICATIONS

This application is a divisional application of application Ser. No. 10/079,494, filed Feb. 22, 2002, now U.S. Pat. No. 7,100,278, which is a continuation-in-part of application Ser. No. 09/010,490, filed Jan. 21, 1998, now U.S. Pat. No. 6,789,310, which is a continuation of application Ser. No. 08/740,992 filed Nov. 5, 1996, now U.S. Pat. No. 5,778,525.

BACKGROUND OF THE INVENTION

The present invention relates to component mounting apparatus and method for automatically mounting a variety of components such as electronic components onto a printed circuit board or the like, and component mounting equipment including the apparatus.

Generally, in an electronic component mounting apparatus, a number of component supply devices are mounted parallel to one another on a component supply table. During a component mounting stage, the component supply devices are successively positioned its a specified component supply position according to a sequence of mounting components while moving the component supply table in a direction in which the component supply devices are arranged in parallel. Then, each of the components at the component supply devices is removed via suction by a mounting head section, and the components are transferred to a circuit board positioned at a circuit board positioning section to be subjected to a component mounting process.

This type of conventional component mounting apparatus will be described with reference to FIG. 33 showing a perspective view thereof, and FIG. 34 showing a schematic plan view thereof. In FIG. 33, at a front of an apparatus body 1 is provided a board positioning section 4 for positioning a circuit board P supplied from a board supply device 2 at a mounting position, and the circuit board P mounted with required components at the board positioning section 4 is discharged by a board discharge device 3. On the other hand, at a rear of the apparatus body 1 is provided a component supply section 7, and a rotary type mounting head section 8 is provided between the component supply section 7 and the aforementioned board positioning section 4 as shown in FIG. 34.

In the component supply section 7, two component supply tables 10 and 11 are laterally movably provided independently of each other on a guide rail 9. The component supply tables 10 and 11 are mounted with a number of component supply devices 12 arranged parallel to one another in a direction in which the component supply tables 10 and 11 move. There is illustrated generally a so-called parts cassette as component supply device 12, and it will be simply described below. That is, electronic components of an identical type are stored and arranged at regular intervals on a carrier tape while being wound around a reel 13 as covered with a cover tape. By drawing out the carrier tape from the reel 13 to feed it at a pitch equal to storage intervals of the components, and taking up the cover tape, an electronic component located at a leading end is positioned at a component supply position A opposite to a component suction head 14 of the mounting head section 8.

Furthermore, as shown in FIG. 34, the mounting head section 8 is constructed by providing a plurality of component suction heads 14 at regular angular intervals on an identical circle of a rotary table (not shown) provided rotatably around a vertical axis. Each component suction head 14 is designed to suck a component by performing vacuum suction. Upon intermittently rotating the rotary table, it is stopped in steps at the component supply position A and a component mounting position B in order to concurrently perform receiving of each component from the component supply device 12 and mounting of each component onto the circuit board P. While one component supply table 10 is supplying components, the other component supply table 11 that has retreated to a standby position performs changing of component supply device 12 and replenishing of components, thereby achieving preparation so that the component mounting apparatus can be operated continuously.

In recent years, there has been a growing trend in that types of circuit boards P to be manufactured and types of components to be mounted onto the circuit boards P are increasing. In order to cope with this, one solution to be considered is to increase a number of component supply devices 12 mounted on the component supply tables 10 and 11. However, in such a case, the component supply tables 10 and 11 are to be elongated sidewise in order to increase the number of component supply devices 12. Consequently, a length of the component supply section 7 in its entirety becomes very long, and this leads to a degraded space utilization efficiency, thereby reducing productivity per floor area.

A more important issue is that the component supply tables 10 and 11 are fed at a pitch in accordance with removal of components by the mounting head section 8, and therefore, the following inconvenience occurs. That is, when the component supply tables 10 and 11 increase in weight due to an increase of their lengths, not only is a greater drive power required to move the component supply tables 10 and 11, but also an inertial force of the component supply tables 10 and 11 increases. Therefore, vibration during feeding of the component supply tables 10 and 11 at this pitch significantly increases. Consequently, it is impossible to increase a component supply rate, or a component mounting operation speed.

SUMMARY OF THE INVENTION

Accordingly, it is an object of the present invention to provide a component mounting apparatus and method capable of increasing a component mounting operation speed without dimensionally increasing a size of the apparatus even when types of boards and a number of components to be mounted on each board increase.

In accomplishing these and other objects, according to a first aspect of the present invention, there is provided a component mounting apparatus comprising: a pair of component supply sections for accommodating a plurality of components, the component supply sections being arranged on opposite sides of a board positioning section; a first mounting head section including a rotary member adapted to be rotatively driven about a horizontal axis, a plurality of component suction nozzles attached to the rotary member along respective axes which each intersect the horizontal axis, and a recognition section opposed to the rotary member. The first mounting head section is operable to perform successive suction operations in order to pick up components with the plurality of component suction nozzles and to perform successive recognition operations of the components respectively sucked by the component suction nozzles via the recognition section upon intermittent rotation of the rotary member at one of the component supply sections. The first mounting head section is also operable to successively mount the components respectively sucked by the component suction nozzles onto the board upon intermittent rotation of the rotary member at the board positioning section. The component mounting apparatus also comprises a second mounting head section including a rotary member adapted to be rotatively driven about a horizontal axis, a plurality of component suction nozzles attached to the rotary member along respective axes which each intersect the horizontal axis, and a recognition section opposed to the rotary member. The second mounting head section is operable to perform successive suction operations in order to pick up components with the plurality of component suction nozzles and to perform successive recognition operations of the components respectively sucked by the component suction nozzles via the recognition section upon intermittent rotation of the rotary member at another of the component supply sections. The second mounting head section is also operable to successively mount the components respectively sucked by the component suction nozzles onto the board upon intermittent rotation of the rotary member at the board positioning section.

With this arrangement, the component supply sections are installed fixedly, and therefore it becomes free of vibration regardless of a size thereof. The mounting head sections are each a robot type which sucks a plurality of components from the component supply table at one time and thereafter successively mounts the components to specified sections of the board. Therefore, even if a number of the components to be mounted increases, a component mounting operation speed can be remarkably increased further than that in a conventional apparatus in which the component supply table is fed at a pitch with respect to the rotary type mounting head section.

Further, the components can be mounted by both of the first and second mounting head sections onto a board positioned at a single board positioning section, and therefore component mounting speed can be further increased.

Furthermore, the first and second mounting head sections respectively perform successive suction, recognition, and mounting of components, and therefore component mounting speed can be further increased.

It is preferable that each of the first and second mounting head sections comprises a plurality of nozzle rotation driving mechanisms for rotating a corresponding component suction nozzle around its respective axis with respect to its rotary member, and each of the component suction nozzles of the first and second mounting head sections can be rotated around the axes thereof by the nozzle rotation driving mechanisms in accordance with recognition results from a corresponding recognition section, thereby performing successive adjustment of postures of the components sucked by the component suction nozzles.

With this arrangement, adjustments of postures of the components sucked by the first and second mounting head sections can be successively performed, and therefore an increased mounting operation speed can be achieved.

Specifically, the rotary members of the first and second mounting head sections can be intermittently rotated at regular angular intervals at a component supply table, wherein at an angular position of a rotary member where one of the component suction nozzles is opposed to the component of the component supply table, another one of the component suction nozzles is opposed to the recognition section.

Alternatively, the rotary members of the first and second mounting head sections can be intermittently rotated at regular angular intervals at the component supply table, wherein a component sucked by one of the component suction nozzles is opposed to a corresponding recognition section during rotation of a corresponding rotary member.

Each of the first and second mounting head sections may comprise an illuminator for illuminating components sucked by the component suction nozzles when each of the components is opposed to a corresponding recognizing section.

It is preferable that each of the first and second mounting head sections comprises a head main body which includes the rotary member, a frame which supports the head main body and the recognition section, and an elevation mechanism for elevating the head main body with respect to the frame.

Alternatively, each of the first and second mounting head sections may comprise a head main body which includes the rotary member, a frame which supports the head main body and the recognition section, and an elevation mechanism for elevating the frame.

It is preferable that the rotary members of the first and second mounting head sections are adapted to rotate at a lower speed at an end of rotation with respect to speed at a start of rotation.

With this arrangement, an influence of an inertial force is suppressed so that the rotary member can be reliably stopped at a correct angular position. Therefore, the component suction nozzles can be positioned with respect to components supplied from the component supply tables and the board at the board positioning section with high precision.

The first and second mounting head sections are independently movable between the component supply sections and the board positioning section, and the first mounting head section can perform successive mounting of components onto the board positioned at the board positioning section while the second mounting head section performs successive component suction and recognition operations at the component supply section.

One of the first and second mounting head sections is adapted to mount components at high speed, and the other of the first and second mounting head sections is adapted to mount components that require mounting with a high degree of precision.

Alternatively, either the first or second mounting head section can be selectively operated in accordance with a type of board positioned at the board positioning section, and one of the first and second mounting head sections is adapted to mount larger components, while the other of the first and second mounting head sections is adapted to mount smaller components.

It is preferable that the first or second mounting head section performs suction of larger components after finishing suction of smaller components.

Further, it is preferable that the first or second mounting head section performs mount operations of smaller components after mounting larger components.

These sequences of execution of suction and mounting of components suppresses an influence of inertial force, resulting in that each rotary member can be reliably stopped at a correct rotational angular position. Therefore, the component suction nozzles can be positioned with respect to the components supplied from the component supply table and the board at the board positioning section with high accuracy.

According to a second aspect of the present invention, there is provided a component mounting apparatus comprising: a pair of component supply sections for accommodating a plurality of components, the component supply sections being arranged on opposite sides of a board positioning section; first and second mounting head sections, with each of the first and second mounting head sections comprising a rotary member capable of being rotatively driven about a horizontal axis, a plurality of component suction nozzles attached to the rotary member along axes which each intersect the horizontal axis, and a plurality of nozzle rotating driving mechanisms for rotating the component suction nozzles respectively; and first and second recognition sections for recognizing each of the components sucked by the first and second mounting head sections. Each of the first and second mounting head sections is operable to successively suck components by the component suction nozzles upon rotation of its rotary member at one of the component supply sections, move to one of the first and second recognition sections to perform successive recognition of the components sucked by the component suction nozzles upon rotation of the rotary member, rotate the component suction nozzles around respective axes thereof by respective nozzle rotation driving mechanisms in accordance with recognition results from the recognizing sections so as to perform successive adjustment of postures of the components sucked to the component suction nozzles, and successively mount the components sucked by the plural component suction nozzles onto the board upon rotation of the rotary member at the board positioning section.

According to a third aspect of the present invention, there is provided a method of mounting components, the method comprising: positioning a mounting head section with respect to a component supply section; successively sucking components supplied from the component supply section by component suction nozzles attached to a rotary member of the mounting head section, wherein the component suction nozzles intersect a horizontal axis of the rotary member, and the components are sucked by rotating the rotary member about the horizontal axis; recognizing the components sucked by the component suction nozzles by a recognition section, wherein sucking and recognizing operations are performed simultaneously; rotating the component suction nozzles around axes thereof with respect to the rotary member in accordance with recognition results from the recognition section, thereby performing successive adjustment of postures of the components sucked by the component suction nozzles; positioning the mounting head section with respect to a board; and successively mounting the components sucked by respective component suction nozzles onto the board by intermittently rotating the rotary member of the mounting head section. The recognizing operation may be performed after the sucking operation.

With this method, suction, recognition, and mounting of components are successively performed, and therefore a mounting operation speed can be increased.

In this method, it is preferable that the mounting head section comprises a first and second mounting head section, and the component supply section comprises a first and second component supply section respectively corresponding to the first and second mounting head sections. It is preferable that the method further comprises: halting successive suction, recognition, adjustment, and mounting operations of components by one of the first and second mounting head sections when one of the component supply sections corresponding to the one mounting head section needs to be replenished with components, while continuing successive suction, recognition, adjustment, and mounting operations of components by the other of the first and second mounting head sections; detaching the one of the component supply sections to permit it to be replenished with components; replenishing the one of the component supply sections with components; reattaching the one of the component supply sections following replenishment thereof; and restarting the successive suction, recognition, adjustment, and mounting operations by the one of the first and second mounting head sections.

With this method, one of the first and second mounting head sections is only halted for performing replenishment of the components thereto, thereby keeping reduction of productivity to a minimum.

BRIEF DESCRIPTION OF THE DRAWINGS

These and other objects and features of the present invention will become clear from the following description taken in conjunction with the preferred embodiments thereof with reference to the accompanying drawings, in which:

FIGS. 20A through 20H are schematic front views for describing operations of the rotary member and the component suction nozzles during the successive sucking and recognizing performed by the apparatus of the third embodiment of the present invention;

FIG. 21 is a time chart for describing an operation of a component mounting apparatus according to a fourth embodiment of the present invention;

FIG. 29 is a schematic front view for describing a problem relating to rotational speed of a rotary member;

FIGS. 31A and 31B are schematic plan views for describing selective usage of two mounting head sections according to a type of a circuit board;

FIGS. 32A through 32C are schematic plan views for describing a method for replenishing components to a component supply table;

DETAILED DESCRIPTION OF THE PREFERRED EMBODIMENTS

Figure 1:
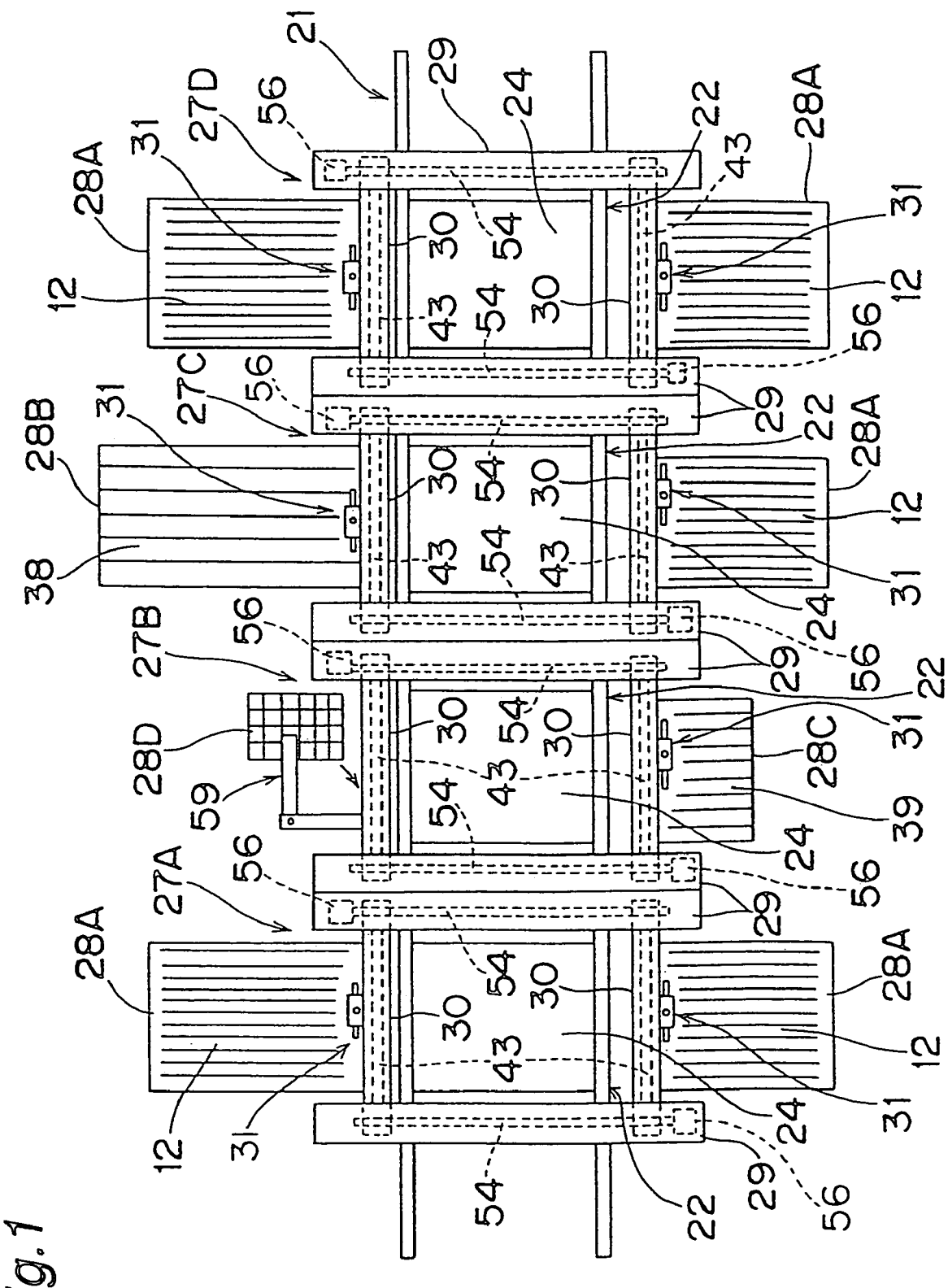
FIG. 1 is a schematic plan view schematically showing component mounting equipment according to an embodiment of the present invention.

Before description of the present invention proceeds, it is to be noted that like parts are designated by like reference numerals throughout the accompanying drawings.

First Embodiment

A first embodiment of the present invention will be described below with reference to FIGS. 1 through 4.

FIG. 1 is a schematic plan view schematically showing component mounting equipment (a component mounting line) according to an embodiment of the present invention. In the figure, four component mounting apparatuses 27A through 27D are provided along a board transfer path 21, and four board transfer devices 22 are provided for the component mounting apparatuses 27A through 27D along the board transfer path 21 in a lateral direction so that each board transfer device 22 supplies a circuit board to be mounted with components to a board mounting position of one of the component mounting apparatuses 27A through 27D and discharges the circuit board therefrom. The component mounting apparatuses 27A through 27D have an identical basic structure, and therefore, the component mounting apparatus 27D is taken as an example to be described below with reference to FIG. 2 that shows a perspective view of it, and FIG. 3 that shows a plan view of its operating mechanism section.

Figure 2:
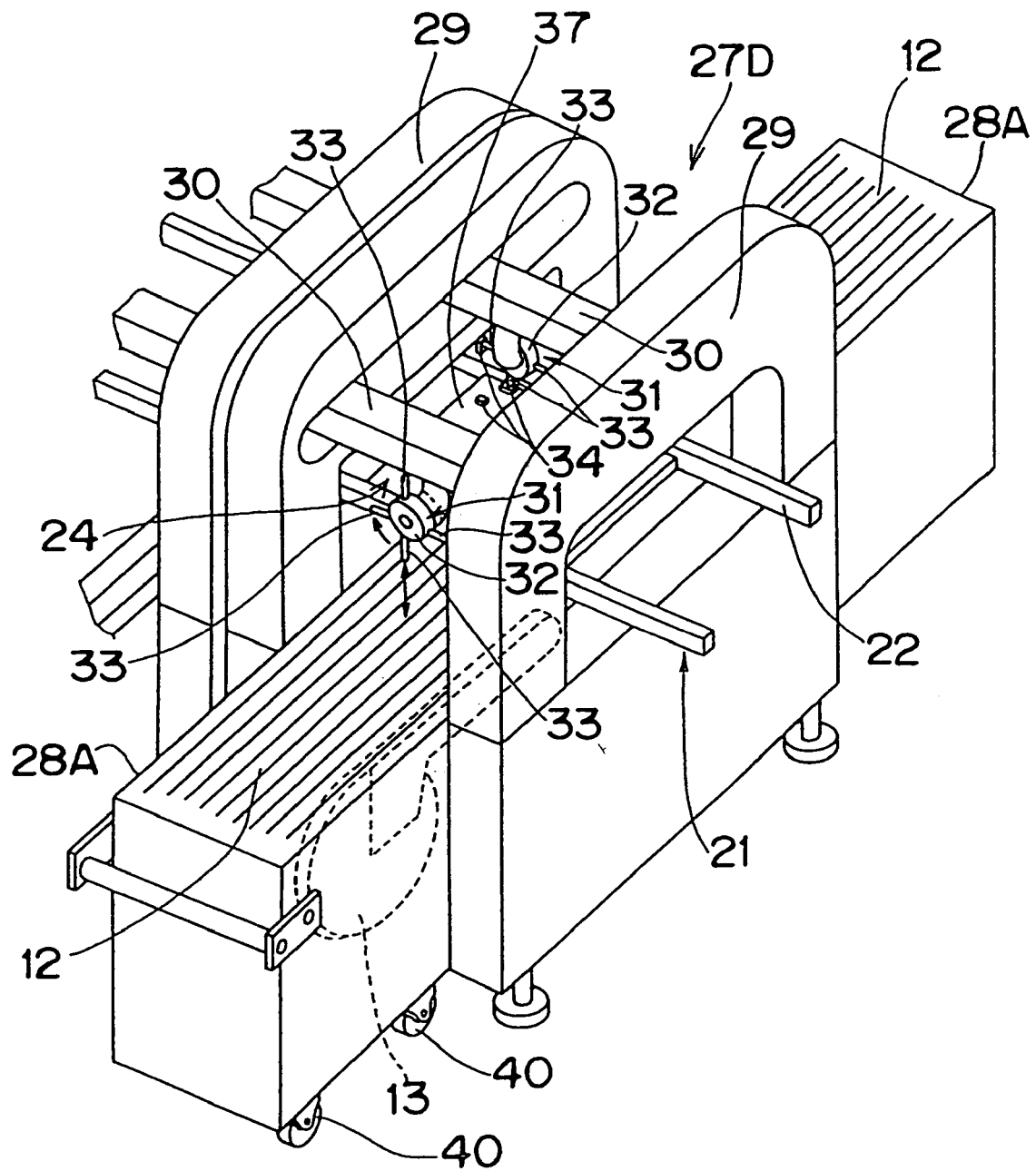
FIG. 2 is a perspective view of a first embodiment of the component mounting apparatus of the present invention, the apparatus being a part of the above equipment shown in FIG. 1.

In the component mounting apparatus 27D shown in FIG. 2, a laterally provided pair of inverted U-shaped support frames 29 are arranged parallel to each other along the board transfer path 21 while allowing the board transfer path 21 to penetrate them. Between both these support frames 29 are arranged two operating frames 30 parallel to each other across the frames 29. The operating frames 30 are supported individually movably in a direction perpendicular to the board transfer path 21. To each operating frame 30 is mounted a mounting head section 31 movably along the operating frame 30. At the mounting head section 31, four component suction nozzles 33 are provided at regular intervals (at intervals of 90 degrees) around a rotary member 32 that is rotatably supported about a horizontal axis. Upon rotating the rotary member 32 at a pitch equal to each interval of the component suction nozzles 33, the component suction nozzles 33 are selectively and sequentially directed downwardly to suck a component 34 from a component supply table 28A and mount this sucked component 34 onto a circuit board 37 located at a board mounting position where the circuit board 37 is positioned by a board positioning section 24.

Between both the support frames 29 are inserted the component supply tables 28A from both depthwise sides as moved by casters 40, and thereafter they are fixedly installed in specified positions. The component supply table 28A is provided with component supply device 12 comprised of parts cassettes provided with aforementioned reels 13. Other than this, as shown in FIG. 1, a component supply table 28B mounted with a stick-shaped component supply device 38 at which components stored in a pipe member are successively fed to a take-out position, a component supply table 28C on which bulk components 39 are placed, and a tray-shaped component supply table 28D are installed at the component mounting apparatuses 27A through 27D. It is to be noted that the tray-shaped component supply table 28D is provided with a mounting head section 59 having a pivot arm shape for removing components thereof.

Figure 3:
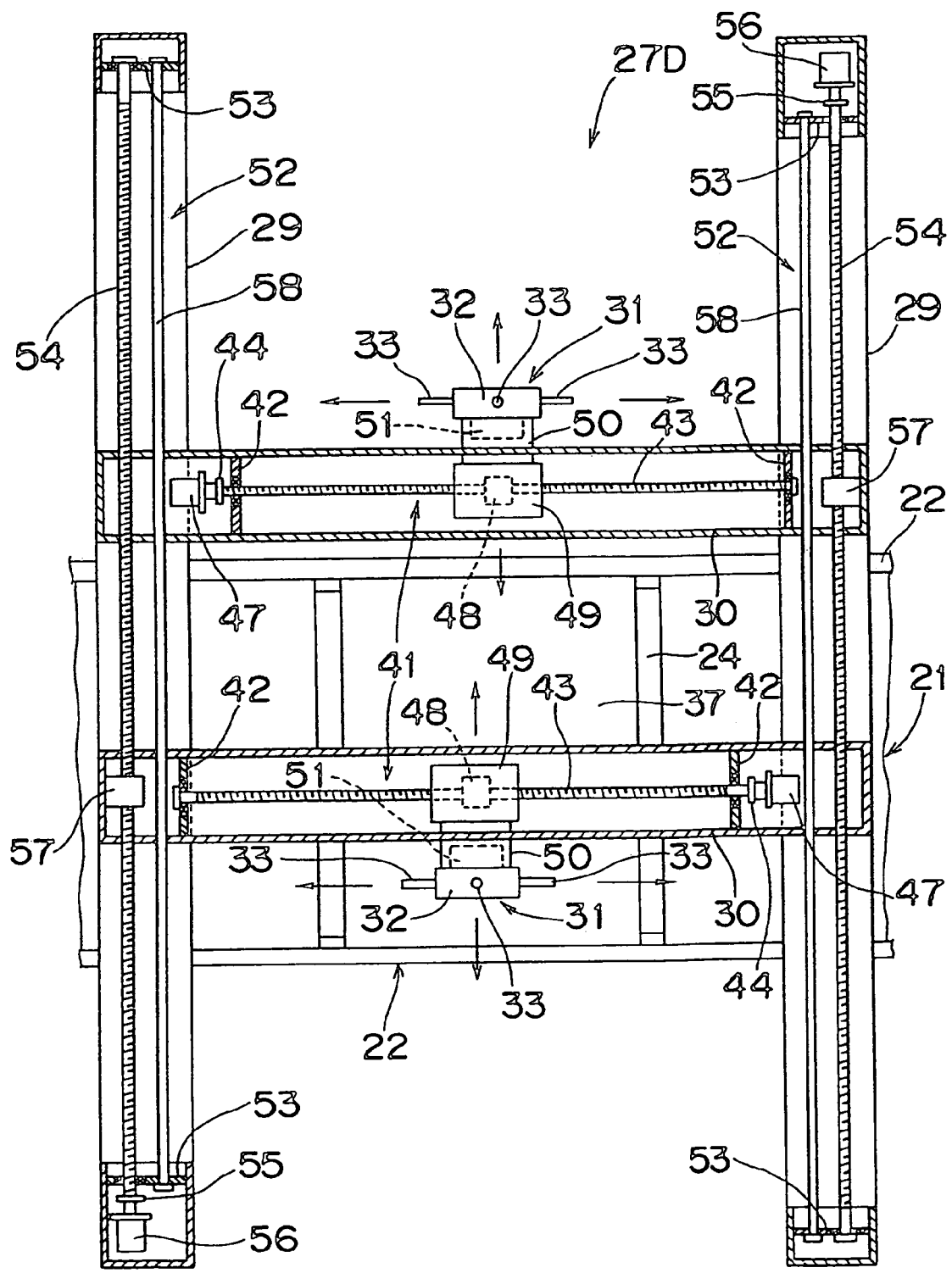
FIG. 3 is a plan view of an operating mechanism section of the apparatus shown in FIG. 2.

In FIG. 3, each operating frame 30 houses therein a head positioning mechanism section 41 for moving the mounting head section 31 in a lengthwise direction of the board transfer path 21.

The head positioning mechanism section 41 is comprised of a ball thread 43 that is rotatably supported across a pair of support plates 42 fixed to both ends of each operating frame 30, a step motor 47 for rotatively driving the ball thread 43 via connecting structure 44, and a moving member 49 in which a nut 48 meshed with the ball thread 43 is internally fixed and moved in accordance with rotation of the ball thread 43. The mounting head section 31 is fixed to the moving member 49 via a head holder 50, and the head holder 50 is internally provided with a known head elevation mechanism section 51 for vertically moving the mounting head section 31.

Figure 5:
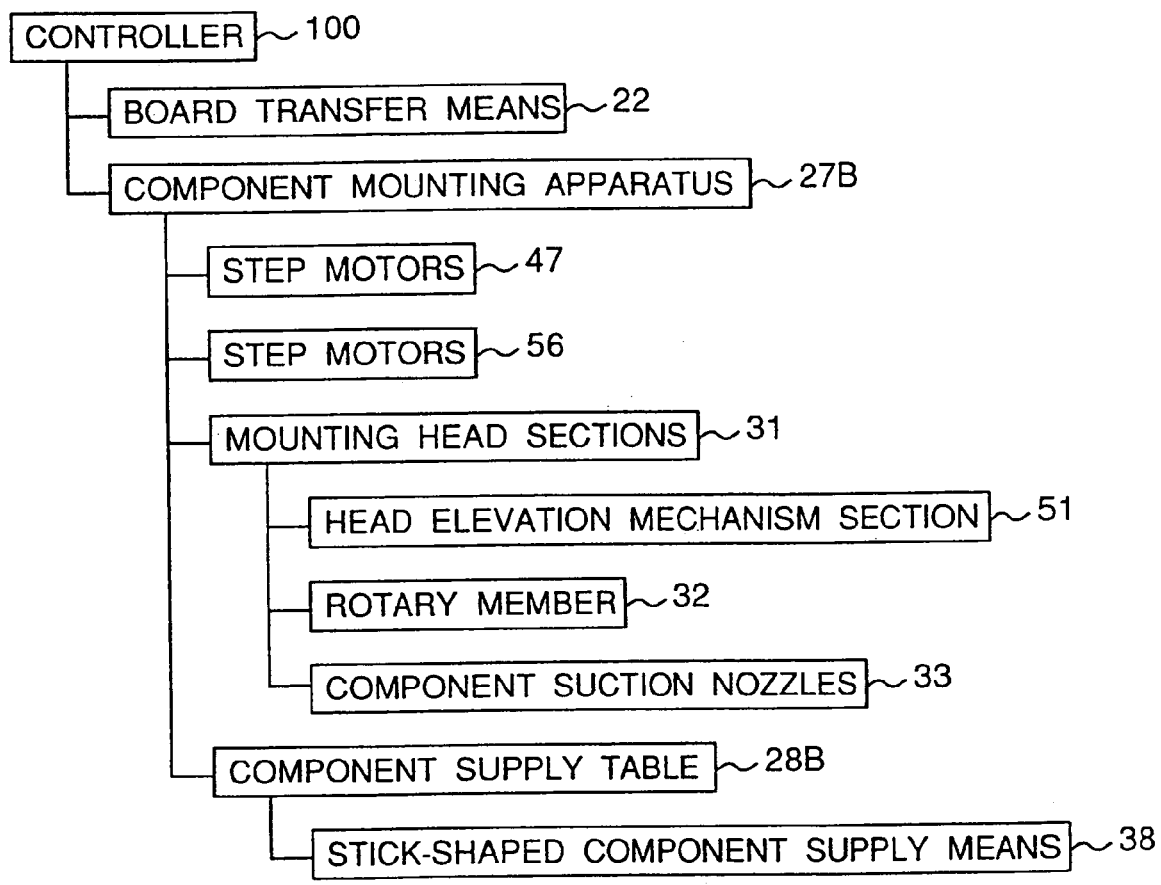
FIG. 5 is a block diagram showing construction for performing a control operation of the apparatus shown in FIG. 2.

Each of the support frames 29 houses therein a head feed mechanism section 52 for moving the head positioning mechanism section 41 via each operating frame 30 in a direction perpendicular to the board transfer path 21. The head feed mechanism section 52 is comprised of a ball thread 54 that is rotatably supported across a pair of support plates 53 fixed to both ends of each support frame 29, a step motor 56 for rotatively driving the ball thread 54 via connecting structure 55, a moving member 57 that is fixed to an end portion of each operating frame 30 as meshed with the ball thread 54 and operates to move the operating frame 30 in accordance with rotation of the ball thread 54, and a guide shaft 58 that is fixed across the support plates 53 and operates to slidably support the operating frame 30 while allowing the guide shaft 58 to penetrate another end of the operating frame 30. A controller 100 controls operations of the apparatuses 27A-27D and the board transfer devices 22, because it is connected to them as shown in FIG. 5 in which connection structure of the apparatus 27B is shown as one example. Connection structure of the apparatuses 27A, 27C, and 27D are similar to that of the apparatus 27B.

Figure 4:
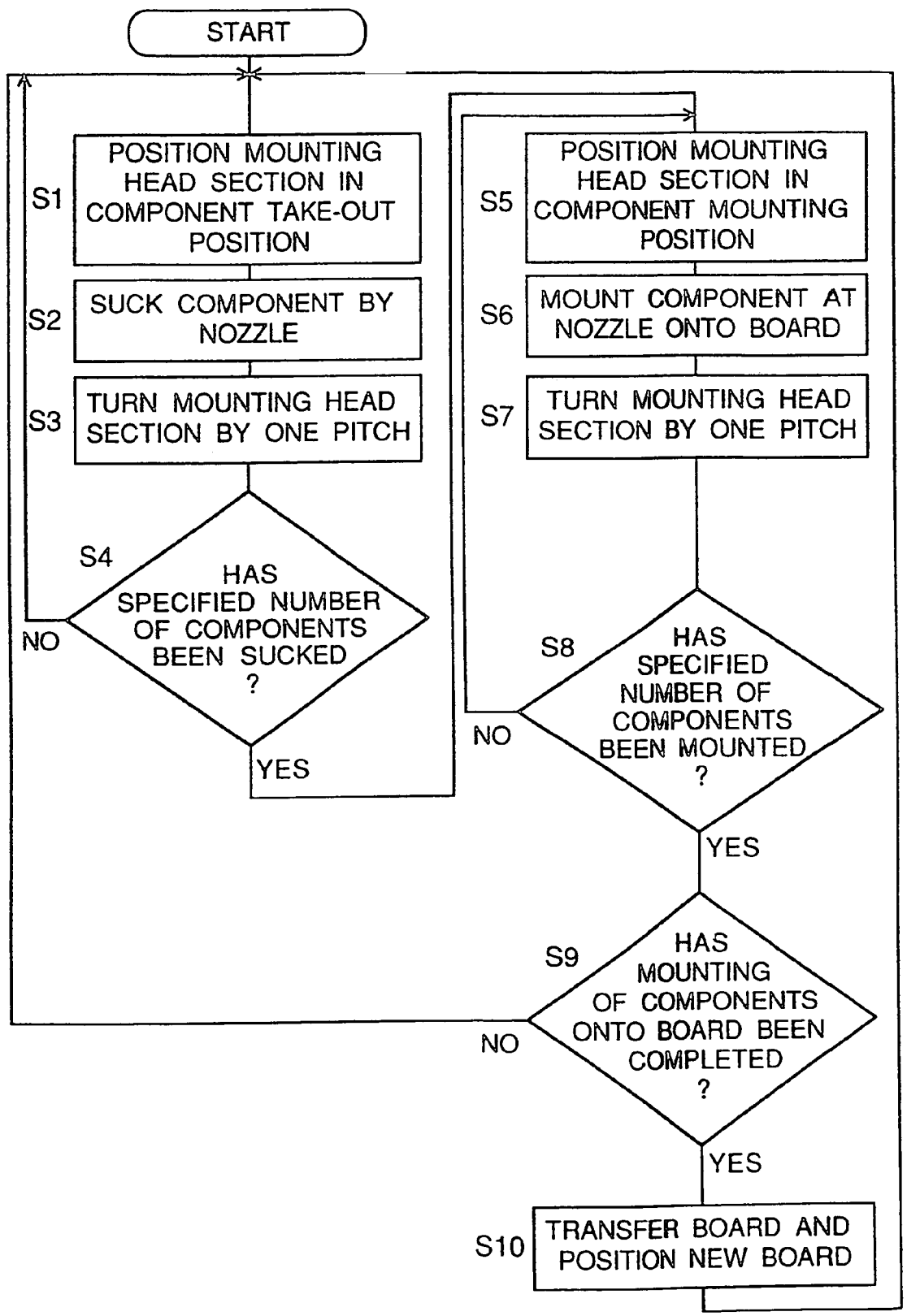
FIG. 4 is a flow chart of the apparatus shown in FIG. 2.

Operation of the aforementioned component mounting equipment will be described next with reference to a flowchart of FIG. 4. In the component mounting apparatuses 27A through 27D, the mounting head sections 31 are controlled in accordance with a timing at which, while one mounting head section 31 is sucking components 34 from one of the component supply tables 28A through 28D, the other mounting head section 31 mounts components 34 onto the circuit board 37. Since both mounting head sections 31 perform an identical operation except for an operating timing shift, only operation of one mounting head section 31 will be now described.

First, the mounting head section 31 is moved to a position just above component 34 to be sucked by suction on one of the component supply tables 28A through 28D, and then positioned (step S1). That is, upon rotating the step motor 47 of the head positioning mechanism section 41 by a specified angle in the required rotational direction, the moving member 49 moves in a lengthwise direction of the board transfer path 21 via the ball thread 43 that is rotating integrally with the step motor 47, and the mounting head section 31 is moved to a specified component take-out position on the one of the component supply tables 28A through 28D. During this stage, with regard to the other component supply tables 28A through 28C, except for the tray-shaped component supply table 28D, a component take-out position is positioned in a straight line extending along the board transfer path 21. Consequently, the mounting head section 31 does not move as positioned in this position until such components as the parts cassette or the stick fronting the mounting head section 31 deplete.

When the mounting head section 31 is positioned, the head elevation mechanism section 51 operates to move downwardly the mounting head section 31, the component suction nozzle 33 sucks a component 34, and thereafter the mounting head section 31 is slightly moved upwardly by the head elevation mechanism section 51 (step S2). Subsequently, the rotary member 32 of the mounting head section 31 is rotated by one pitch, and a next component suction nozzle 33 is made to front the component take-out position (step S3). During this stage, it is decided whether or not the mounting head section 31 has completed suction of a specified number (four in this embodiment) of components 34 (step S4). If this has not been completed, the same operation as above will be repeated to suck the specified number of components 34.

When suction of the specified number of components 34 has been completed, the step motor 56 of the head feed mechanism section 52, and the step motor 47 of the head positioning mechanism section 41, are simultaneously driven to move the mounting head section 31 onto the board positioning section 24 via the operating frame 30 in accordance with rotation of the ball thread 54 and then position it just above a specified component mounting position of the circuit board 37 by the head positioning mechanism section 41 (step S5). Then, the head elevation mechanism section 51 is driven to mount components that have been held by the component suction nozzles 33, as sucked thereto, onto the circuit board 37 (step S6). After the mounting head section 31 is slightly moved upwardly by the head elevation mechanism section 51, the mounting head section 31 is moved to a position just above a next component mounting position of the circuit board 37 and then positioned by operations of the head positioning mechanism section 41 and the head feed mechanism section 52, and the rotary member 32 is rotated by one pitch, so that a component to be mounted next is made to front the component mounting position (step S7).

During this stage, it is decided whether or not mounting of all the components 34 that have been held by the mounting head section 31, as sucked thereto, has been completed (step S8). If it has not been completed, the same operation as above will be repeated to mount all the components 34 onto specified positions of the circuit board 37.

When a specified number of components has been completed at step S8, it is decided whether or not mounting of all the components 34 distributed to the component mounting apparatuses 27A through 27D for the circuit board 37, positioned in the board positioning section 24, has been completed (step S9). If it has not been completed, the mounting head sections 31 are moved again above the component supply tables 28A through 28D to repeat suction of components 34 from the component supply tables 28A through 28D, and performed is mounting of the components 34 onto the circuit board 37 in a manner similar to the above until mounting of all the components 34 onto the circuit board 37 is completed. When mounting of all the components 34 onto the circuit board 37 is completed, each circuit board 37 positioned in the board transfer path 21 is fed by a specified pitch to be positioned in the board positioning sections 24 of the component mounting apparatuses 27A through 27D for a next process (step S10), and an operation similar to the above will be repeated.

In the above component mounting equipment, mutually different components can be provided on the component supply tables 28A through 28D of the plurality (four in this embodiment) of component mounting apparatuses 27A through 27D provided parallel to one another along the board transfer path 21. Therefore, when types and a number of components 34 to be mounted onto the circuit board 37 increase, these components are provided on the component supply tables 28A through 28D as distributed into groups classified by type. With this arrangement, since the component supply tables 28A through 28D are mounted with only the components 34 of respective groups, the tables are not dimensionally increased. Furthermore, since the component supply tables 28A through 28D are installed perpendicularly to the board transfer path 21 at the component mounting apparatuses 27A through 27D, equipment is not dimensionally increased as a whole without significantly expanding in a direction of the board transfer path 21.

Furthermore, since the mounting head section 31 of the component mounting apparatuses 27A through 27D only operate and the component supply tables 28A through 28D are fixedly installed, the tables become free of vibration regardless of a number of mounted component supply devices 12 and 38. Furthermore, the mounting head section 31 sucks at one time a plurality of components 34 from the component supply tables 28A through 28D, and successively mounts the components 34 onto specified portions of the circuit board 37. Furthermore, the component mounting apparatuses 27A through 27D are each provided with a pair of mounting head sections 31 and controls the mounting head sections 31 so that, while one is sucking components 34, components 34 that are held by the other, as sucked thereto, are mounted to the circuit board 37. With the above arrangement, even when types and a number of components 34 to be mounted onto the circuit board 37 increase, a component mounting operation speed can be remarkably increased further than that in a conventional apparatus in which a component supply table is fed at a pitch with respect to a rotary type mounting head section.

When types of circuit boards 37 increase, this can be coped with only by replacing necessary ones of the component supply tables 28A through 28D, installed at the component mounting apparatuses 27A through 27D, with component supply tables 28A through 28D provided with required components 34. It is to be noted that the component mounting apparatuses 27A through 27D can also be used singly.

Second Embodiment

A second embodiment of the present invention will be described below with reference to FIGS. 6 through 16.

Figure 6:
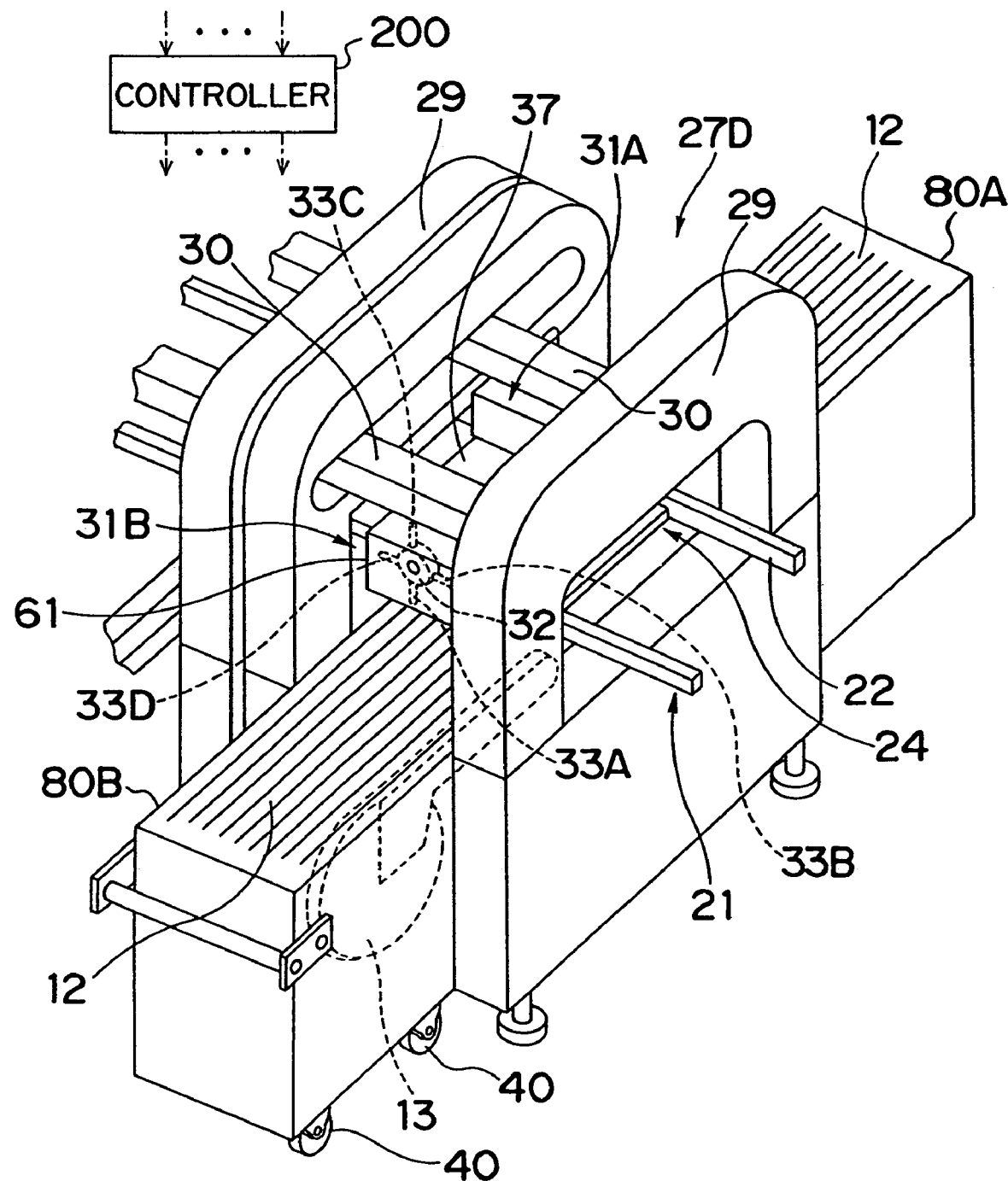
FIG. 6 is a perspective view showing component mounting apparatus according to a second embodiment of the present invention.
Figure 7:
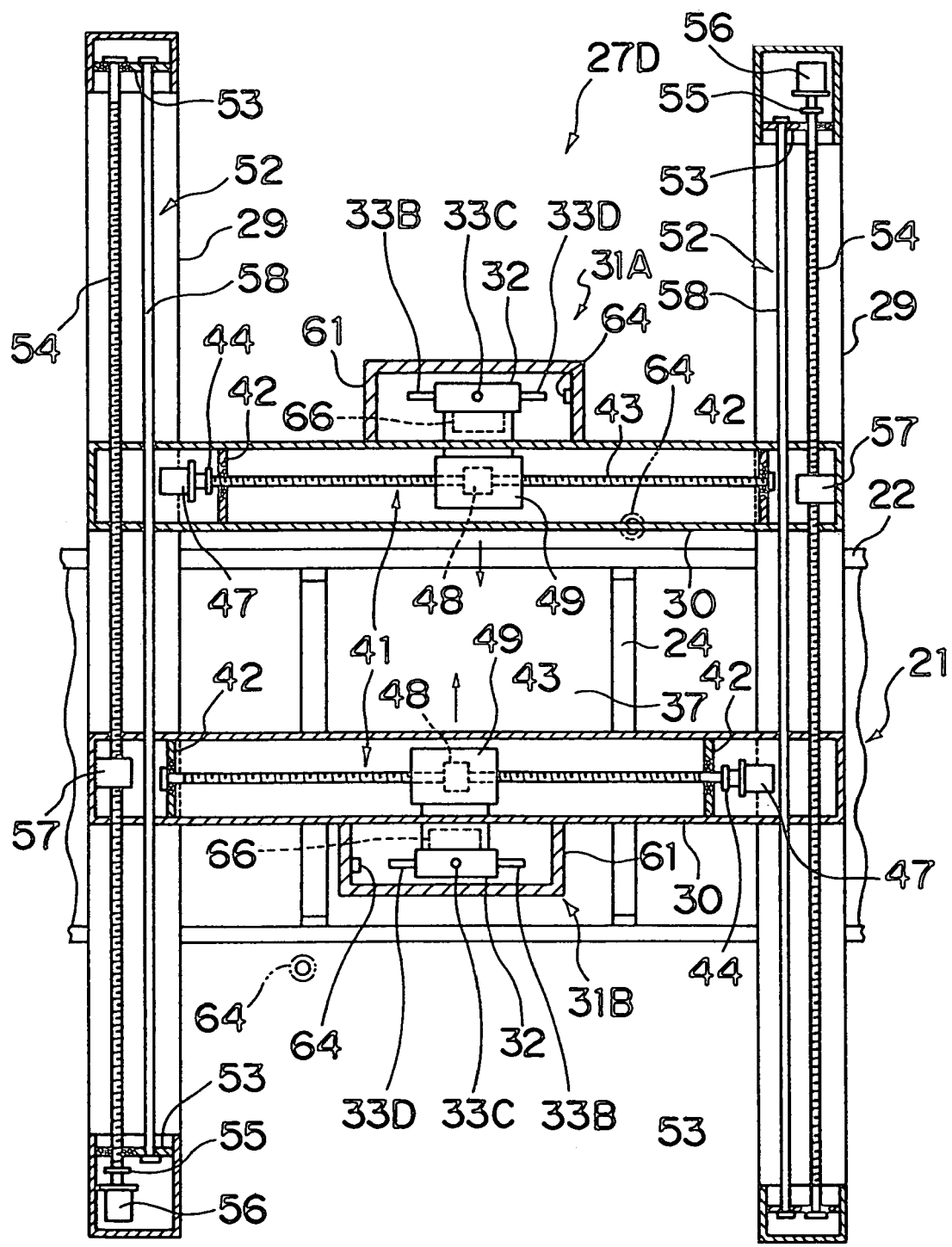
FIG. 7 is a schematic plan view showing the component mounting apparatus according to the second embodiment of the present invention.
Figure 8:
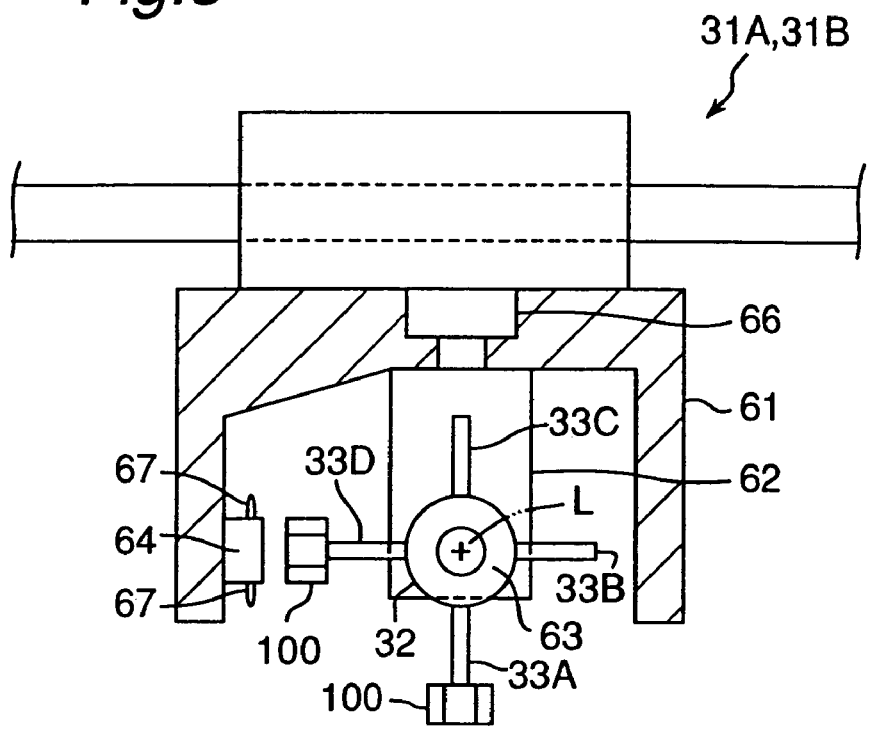
FIG. 8 is a schematic front view showing one example of a mounting head section of the apparatus of the second embodiment.
Figure 9:
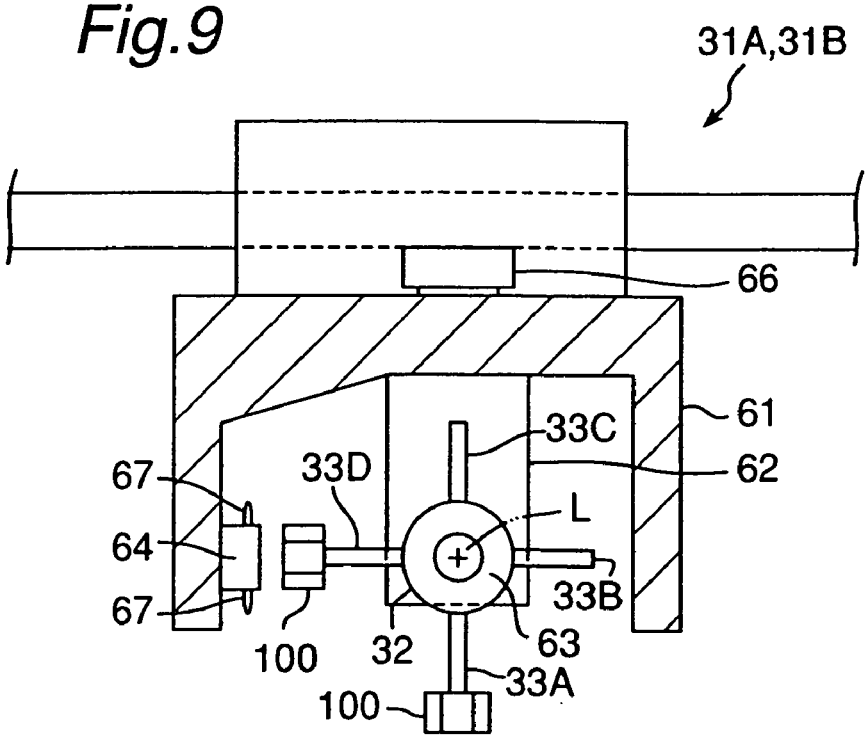
FIG. 9 is a schematic front view showing another example of the mounting head section of the apparatus of the second embodiment.
Figure 10:
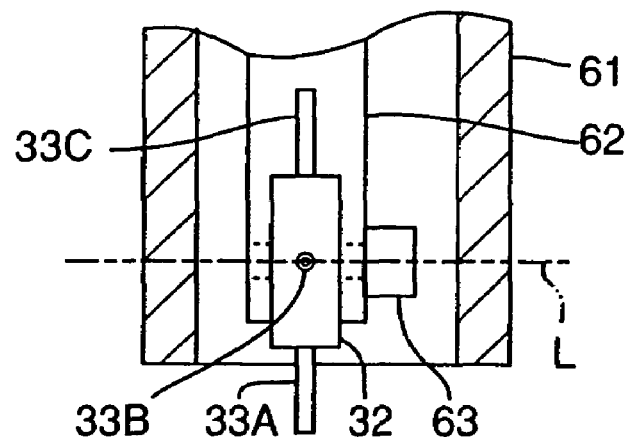
FIG. 10 is a partially enlarged view showing the mounting head section.

In this second embodiment, mounting head sections 31A and 31B of a component mounting apparatus have different structures than those of the first embodiment. Specifically, as shown in FIGS. 6 through 8, each of the mounting head sections 31A and 31B has a hood or frame 61. Held to the frame 61 is a head main body 62 including a rotary member 32 and recognition camera (recognition section) 64. The rotary member 32 is rotatively driven about a lateral or horizontal axis L (refer to FIG. 10) by a head rotating motor 63. Four component suction nozzles 33A, 33B, 33C, and 33D are respectively attached to the rotary member 32 so that their axes orthogonally intersect axis L. The head main body 62 is moved upwardly and downwardly in a vertical direction with respect to the frame 61 by a head elevation motor 66. As shown in FIG. 9, the head elevation motor 66 may move the frame 61 upwardly and downwardly, thereby moving the head main body 62 in the vertical direction.

In this embodiment, the recognition camera 64 is fixed to an inner side of the frame 61 so as to be opposed to one of the component suction nozzles 33A through 33D when this one nozzle is in a horizontal posture. Specifically, as shown in FIG. 8, the recognition camera 64 is arranged so as to be opposed to the component suction nozzle 33D that is positioned at 90 degrees with respect to the component suction nozzle 33A in a vertically downward posture or in a position for sucking component 100. The recognition camera 64 has a field of view directed horizontally. Attached to the recognition camera 64 is an illuminator 67 for illuminating the component 100 that is in a position opposing the recognition camera 64.

Figure 11:
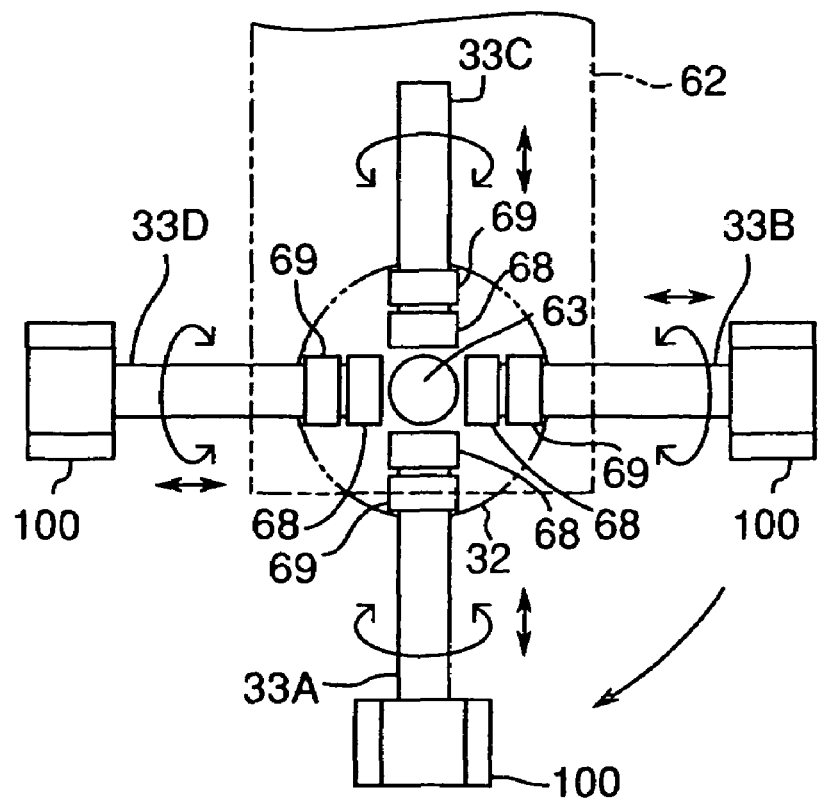
FIG. 11 is a schematic front view showing a rotary member of the mounting head section.

As shown in FIG. 11, four nozzle rotation driving motors 68 are accommodated in the rotary member 32. Each of the nozzle rotation driving motors 68 rotates corresponding component suction nozzle 33A through 33D about an axis thereof with respect to the rotary member 32. Further, four nozzle linear driving motors 69 are accommodated in the rotary member 32. Each of the nozzle linear driving motors 69 moves corresponding component suction nozzles 33A through 33D backward and forward along the axis thereof.

Next, an operation of the component mounting apparatus will be described.

Figure 12:
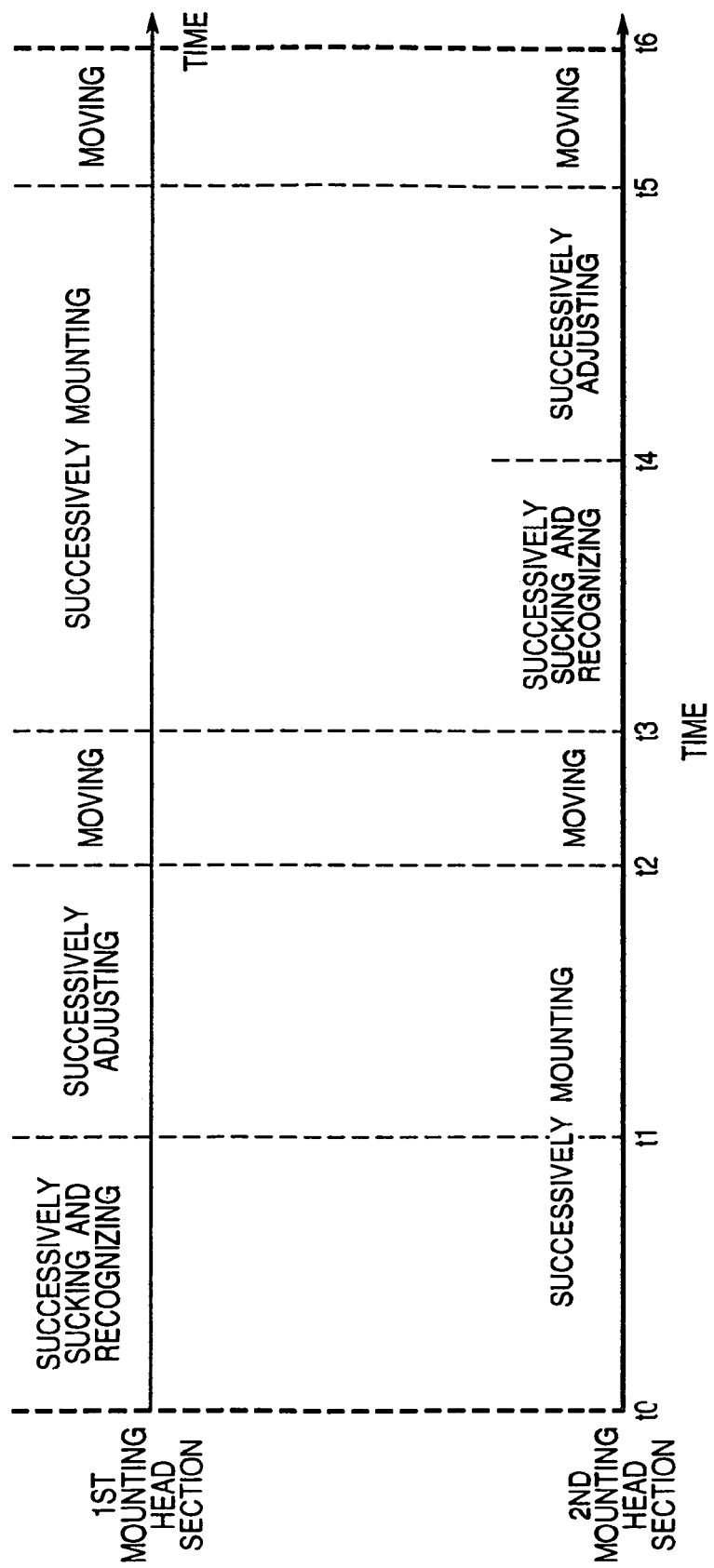
FIG. 12 is a time chart for describing an operation of the component mounting apparatus of the second embodiment.

As shown in FIG. 12, while, the first mounting head section 31A is successively sucking components 100 from a corresponding component supply table 80A and recognizing these sucked components 100 (time t0 to time t1), and thereafter adjusting postures of these sucked and recognized components 100 (time t1 to time t2), the second mounting head section 31B successively mounts adjusted components 100 onto a circuit board 37 positioned at board positioning section 24 (time t0 to time t2). Contrary to this, while the second mounting head section 31B is successively sucking components 100 from a corresponding component supply table 80B and recognizing these sucked components 100 (time t3 to time t4), and thereafter adjusting postures of these sucked and recognized components 100 (time t4 to time t5), the first mounting head section 31A successively mounts adjusted components 100 onto the circuit board 37 positioned at the board positioning section 24 (time t3 to time t5).

Successive suction and recognition of the components 100 will be described below with reference to FIG. 13 and FIGS. 15A through 15D.

Figure 13:
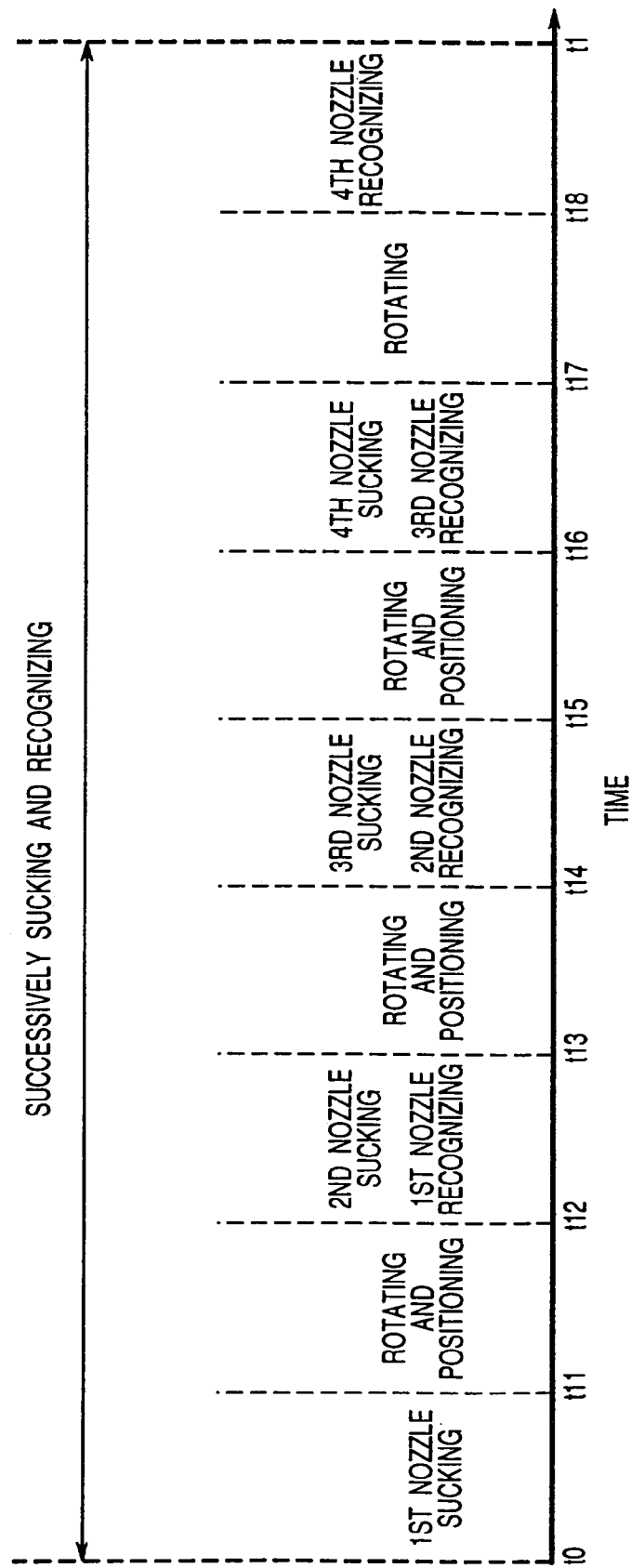
FIG. 13 is a time chart for describing successive sucking and recognizing performed by the apparatus of the second embodiment.

In this successive suction and recognition of the components 100, suction of the components 100 by the component suction nozzles 33A through 33D, and recognition of the components 100 that have been sucked to the component suction nozzles 33A through 33D by the recognition camera 64, are simultaneously or concurrently performed while intermittently rotating the rotary member 32 at a predetermined regular angular interval (90 degrees in this embodiment) about the axis L. Specifically, two types of operations are repeated as shown in FIG. 13. These two types of operations include an operation where one of the four component suction nozzles 33A through 33D sucks a component 100 concurrently with recognition of another component 100, that has been sucked to one of remaining component suction nozzles 33A through 33D, by the recognition camera 64, and an operation where the rotary member 32 is rotated and the first mounting head section 31A is positioned with respect to one of component supply devices 12 on the component supply table 80A.

At the beginning of the successive suction and recognition, the first mounting head section 31A has been moved above the corresponding component supply table 80A by head positioning mechanism section 41 and head feed mechanism section 52. Further, the first mounting head section 31A has been positioned at a predetermined level position with respect to the component supply table 80A by the head elevation motor 66.

Figure 15A:
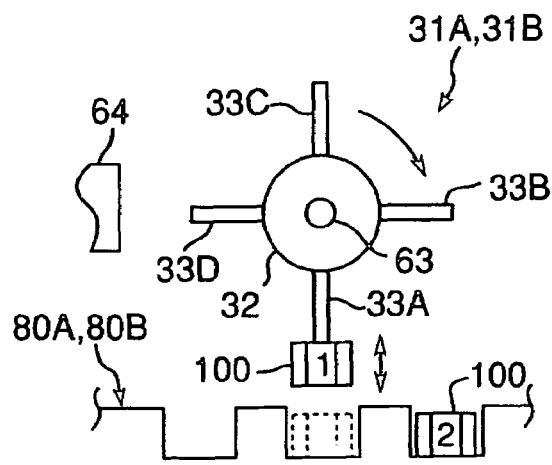
FIGS. 15A through 15D are schematic views for describing operations of the rotary member and nozzles during successive sucking and recognizing performed by the apparatus of the second embodiment of the present invention.

First, as shown in FIG. 15A and a time period from time t0 to time t11 of FIG. 13, the first component suction nozzle 33A is projected by the nozzle linear driving motor 69, and thereafter sucks component 100 to pick up this component from the component supply table 80A. After completion of this suction, the component suction nozzle 33A is moved backwards by the nozzle linear driving motor 69.

Next, as shown in a time period from t11 to t12 in FIG. 13, the rotary member 32 is rotated by an angle of 90 degrees in a clockwise direction in the figures by the head rotating motor 63, and the first mounting head section 31A is positioned with respect to one of the component supply devices 12 by the head positioning mechanism section 41.

Figure 15B:
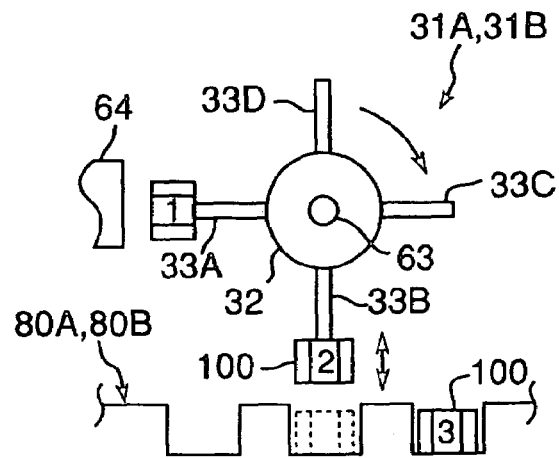

As shown in FIG. 15B, rotation of the rotary member 32 results in that second component suction nozzle 33B is directed downwardly in a vertical direction. Further, rotation of the rotary member 32 results in that the first component suction nozzle 33A, to which the component 100 has been sucked, is directed horizontally. In this state, the second component suction nozzle 33B projects, and thereafter sucks another component 100 to pick up this component from the component supply table 80A. Concurrently with suction of the component 100, the recognition camera 64 recognizes the component 100 sucked to the first component suction nozzle 33A (time t12 to time t13).

Figure 15C:
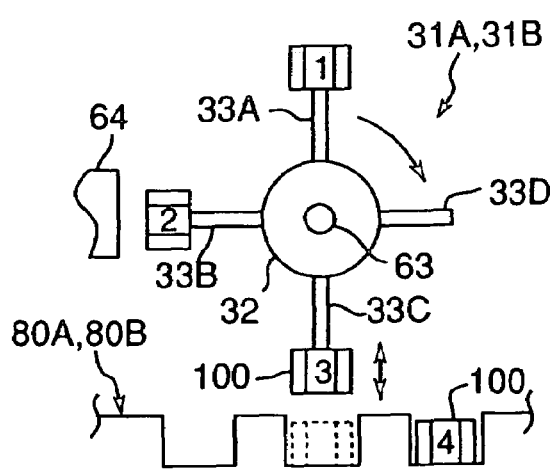
Figure 15D:
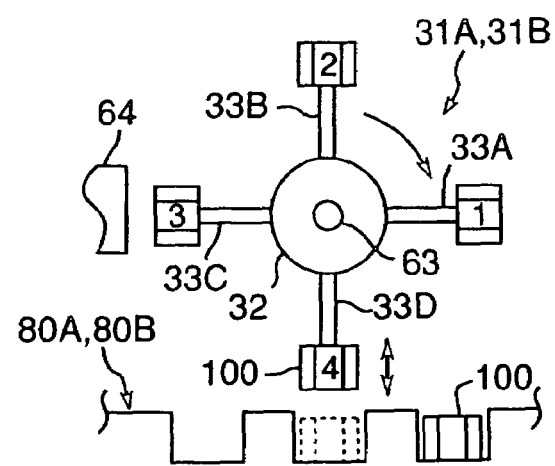

Next, as shown in a time period from time t13 to time t14 in FIG. 13, the rotary member 32 is rotated by an angle of 90 degrees and the first mounting head section 31A is positioned. As shown in FIG. 15C, this rotation of the rotary member 32 results in that third component suction nozzle 33C is directed downwardly in the vertical direction, and the second component suction nozzle 33C which has sucked component 100 is directed horizontally. While the rotary member 32 is at this angular position, the third component suction nozzle 33C sucks another component 100 to pick up this component from the component supply table 80A and the recognition camera 64 concurrently recognizes the component 100 that has been sucked by the second component suction nozzle 33B (time t14 to time t15 in FIG. 13).

Next, as shown in a time period from time t15 to time t16, the rotary member 32 is rotated by an angle of 90 degrees and the first mounting head section 31A is positioned. Then, while the rotary member 32 is at the angular position shown in FIG. 15D, the fourth component suction nozzle 32D sucks another component 100 to pick up this component from the component supply table 80A, and the recognition camera 64 concurrently recognizes the component 100 that has been sucked to the third component suction nozzle 33C (time 16 to time t17 in FIG. 13).

After completion of further rotation of the rotary member 32 by 90 degrees (time t17 to time t18), the recognition camera 64 recognizes the component 100 that has been sucked to the fourth component suction nozzle 33D (time t18 to time t1).

Then, during successive adjustment of postures shown in a time period from time t1 to time t2 in FIG. 12, each of the component suction nozzles 33A through 33D is rotated about the axis thereof at respective angles corresponding to a recognition result of each component 100 that has been sucked to the component suction nozzles 33A through 33D, as received from the recognition camera 64 (refer to FIG. 11). As a result, postures of all components 100 respectively sucked by component suction nozzles 33A through 33D are adjusted. The nozzle rotation driving motor 68 for each component suction nozzles 33A through 33D may be activated simultaneously or sequentially either singly or in combination.

After suction of the components 100 by all of the four nozzles 33A through 33D, recognition of the components 100, and completion of posture adjustment of these components 100, the first mounting head section 31A is moved by the head positioning mechanism section 41 and the head feed mechanism section 52 above the circuit board 37 positioned at the board positioning section 24 (time t2 to time t3 in FIG. 12). Successive adjustment of postures of the components 100 may be performed while the first mounting head section is moving toward the board positioning section 24.

Next, successive mounting of the components 100 during the time period from time t3 to time t5 in FIG. 12 will be described below.

During this successive mounting of the components 100, the components 100 that have been sucked to the component suction nozzles 33A through 33D are successively mounted onto the circuit board 37 while intermittently rotating the rotary member 32 about the axis L at a predetermined regular angular interval (90 degrees in this embodiment). Specifically, as shown FIG. 14, two types of operations are repeated. These two types of operations include an operation where a component 100 sucked to one of the four component suction nozzles 33A through 33D is mounted onto the circuit board 37, and an operation where the rotary member 32 is rotated and first mounting head section 31A is positioned with respect to a predetermined position of the circuit board 37.

Figure 14:
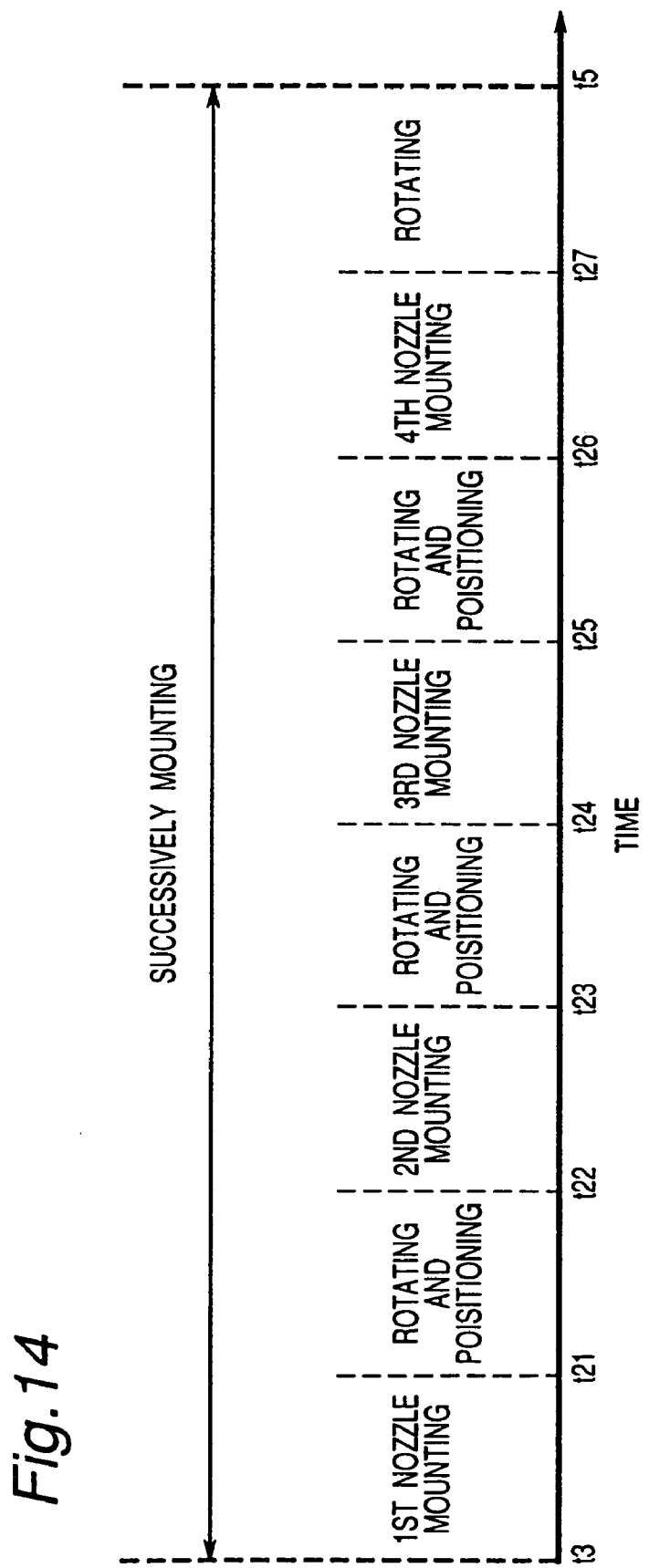
FIG. 14 is a time chart for describing successive mounting performed by the apparatus of the second embodiment.
Figure 16A:
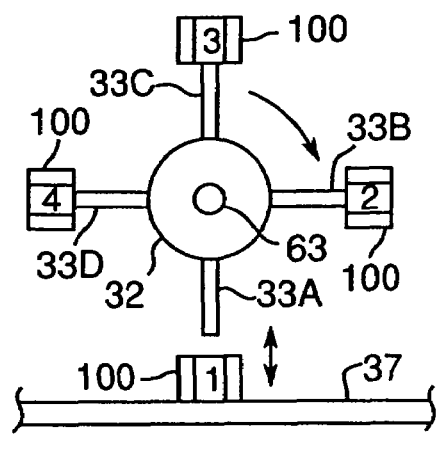
FIGS. 16A through 16D are schematic views for describing operations of the rotary member and component suction nozzles during successive mounting performed by the apparatus of the second embodiment of the present invention.

At the beginning of this successive mounting, as shown in FIG. 16A and a time period from time t3 to time t21 of FIG. 14, the first component suction nozzle 33A is projected by the nozzle linear driving motor 69 to mount the component 100 onto the circuit board 37. Thereafter, the first component nozzle 33A is moved backwards by the nozzle linear driving motor 69.

Figure 16B:
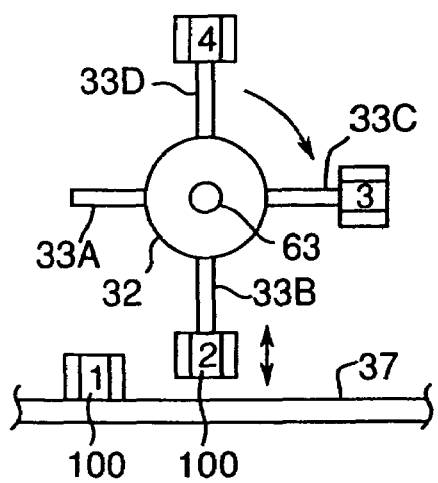

Next, as shown in a time period from time t21 to time t22, the rotary member 32 is rotated 90 degrees in a clockwise direction by the head rotating motor 63, and the first mounting head section 31A is positioned with respect to another position of the circuit board 37 by the head positioning mechanism section 41 and the head feed mechanism section 52. As shown in FIG. 16B, rotation of the rotary member 32 results in that the second component suction nozzle 33B is directed downwardly in the vertical direction. In this state, the second component suction nozzle 33B is projected to mount the component 100 onto the circuit board 37 (time t22 to time t23 in FIG. 14).

Figure 16C:
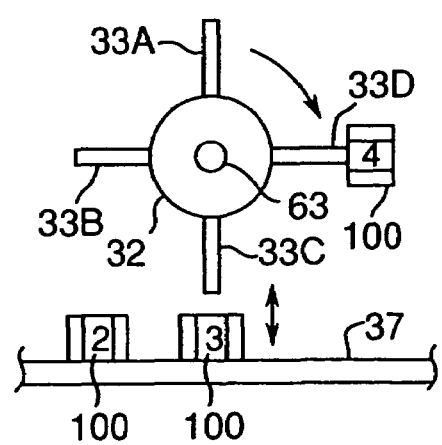

Next, as shown in a time period from time 23 to time t24 in FIG. 14, the rotary member 32 is rotated 90 degrees in the clockwise direction and the first mounting head section 31A is positioned with respect to a further next position of the circuit board 37. As shown in FIG. 16C, this rotation of the rotary member 32 results in that the third component suction nozzle 33C is directed downwardly in the vertical direction. In this state, the third component section nozzle 33C is projected to mount its component 100 onto the circuit board 37 (time t24 to time t25 in FIG. 14).

Figure 16D:
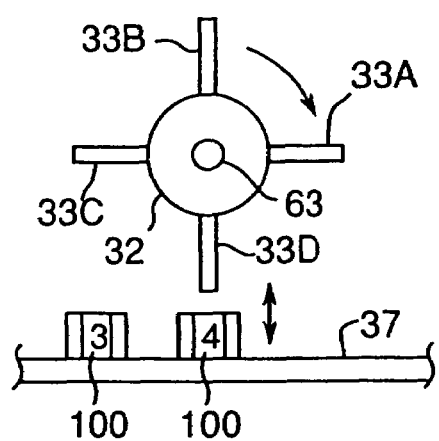

Similarly, after further rotation of the rotary member 32 and positioning of the first mounting head section 31A (time t25 to time t26), the fourth component suction nozzle 33D is projected to mount its component 100 onto the circuit board 37 as shown in FIG. 16D.

After all components 100 sucked to the four component suction nozzles 33A through 33D have been mounted onto the circuit board 37 as described above, the first mounting head section 31A is moved toward the corresponding component supply table 80A by the head positioning mechanism section 41 and the head feed mechanism section 52 (time t5 to time t6 in FIG. 12).

Successive suction and recognition of components 100 by the second mounting head section 31B (time t3 to time t4 in FIG. 12), and successive posture adjustment of these components 100 by the second mounting head section 31B (time t4 to time t5 in FIG. 12) are respectively the same as those performed by the first mounting head section 31A. Successive mounting of the components 100 by the second mounting head section 31B (time period from time t0 to time t2 in FIG. 12) is also same as that performed by the first mounting head section 31A. Other construction and function of the second embodiment are the same as those of the first embodiment described above. Therefore, the same elements are denoted by the same reference numerals, and the description thereof is omitted.

Third Embodiment

Next, a third embodiment of the present invention will be described with reference to FIGS. 17 through 20.

Figure 17:
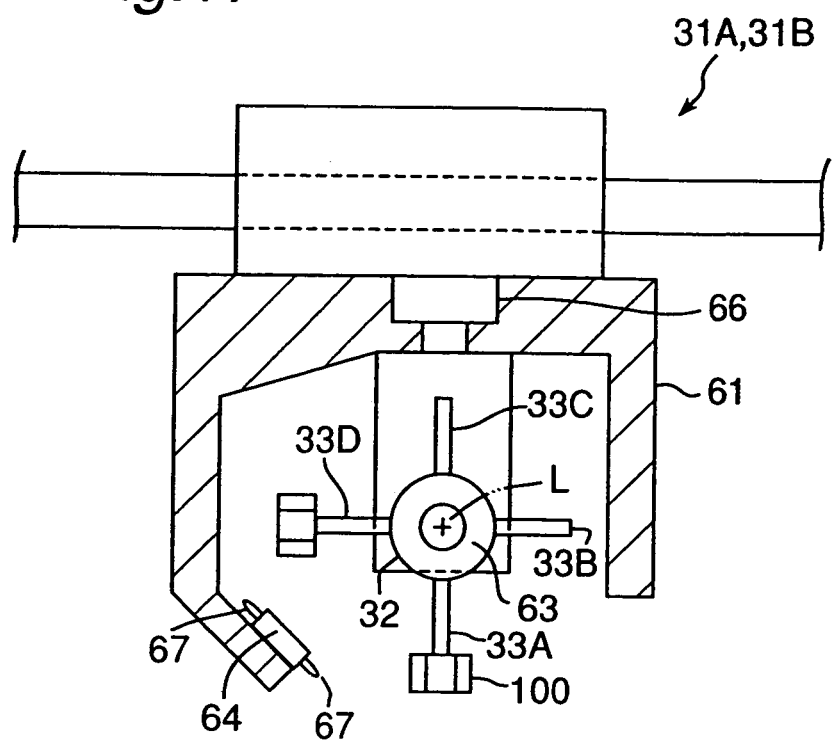
FIG. 17 is a schematic front view showing one example of a mounting head section according to a third embodiment of the present invention.
Figure 18:
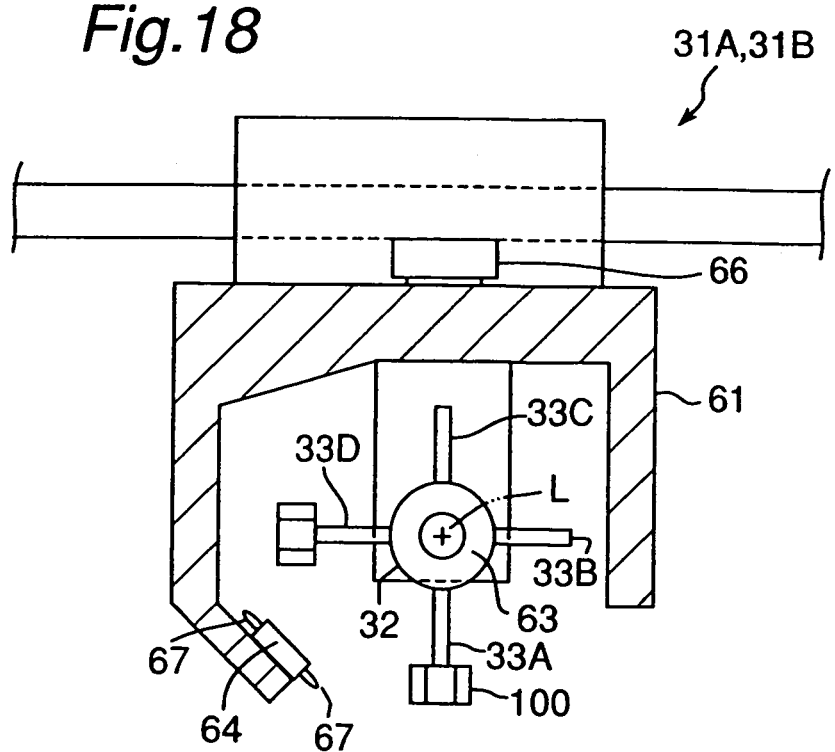
FIG. 18 is a schematic front view showing another example of the mounting head section according to the third embodiment of the present invention.

In the third embodiment, a fixing position of recognition camera 64 relative to frame 61 and a field of view thereof are different from those in the second embodiment. Specifically, as shown in FIG. 17, the recognition camera 64 is positioned with respect to component suction nozzle 33A directed downward in a vertical direction, which is in a position where suction of component 100 is to be performed, at an angular position of 45 degrees in a clockwise direction. Further, the field of view of the recognition camera 64 is directed so as to form an angle of 45 degrees with respect to a horizontal direction in FIG. 17. The fixing position and the field of view of the recognition camera 64 allow that components 100 sucked to component suction nozzles 33A through 33D pass across the field of view of the recognition camera 64 while corresponding component suction nozzles 33A through 33D are changed in their posture from vertically downward directions to horizontal directions. While passing across the field of view of the recognition camera 64, the components 100 are recognized by the recognition camera 64.

Head main body 62 may be moved up and down with respect to the frame 61 by head elevation motor 66 as shown in FIG. 17, or the frame 61 may be moved up and down by the head elevation motor 66, thereby moving the head main body 62 up and down.

Next, operation of the component mounting apparatus according to the third embodiment will be described.

The operation of the third embodiment is similar to that of the second embodiment shown in FIG. 12 as a whole. In other words, first mounting head section 31A repeatedly performs successive suction and recognition of components 100 (time t0 to time t1 in FIG. 12), successive adjustment of postures of the components 100 (time t1 to time t2 in FIG. 12), moving from component supply table 80A to board positioning section 24 (time t2 to time t3 in FIG. 12), successive mounting of the components 100 (time t3 to time t5 in FIG. 12), and moving from the board positioning section 24 to the component supply table 80A (time t5 to time t6 in FIG. 12). Second mounting head section 31B performs successive mounting of components 100 during the successive suction and recognition of the components 100 of the first mounting head section 31A (time t0 to time t2 in FIG. 12). Further, during the successive mounting of the components 100 by the mounting head section 31A, the second mounting head section 31B performs successive suction and recognition of components 100 (time t3 to time t4 in FIG. 12) and successive adjustment of postures of these components 100 (time t4 to time t5).

However, the operation of the third embodiment is different from that of the second embodiment in terms of the successive suction and recognition. The successive suction and recognition in the third embodiment will be described below taken in conjunction with the first mounting head section 31A.

Figure 19:
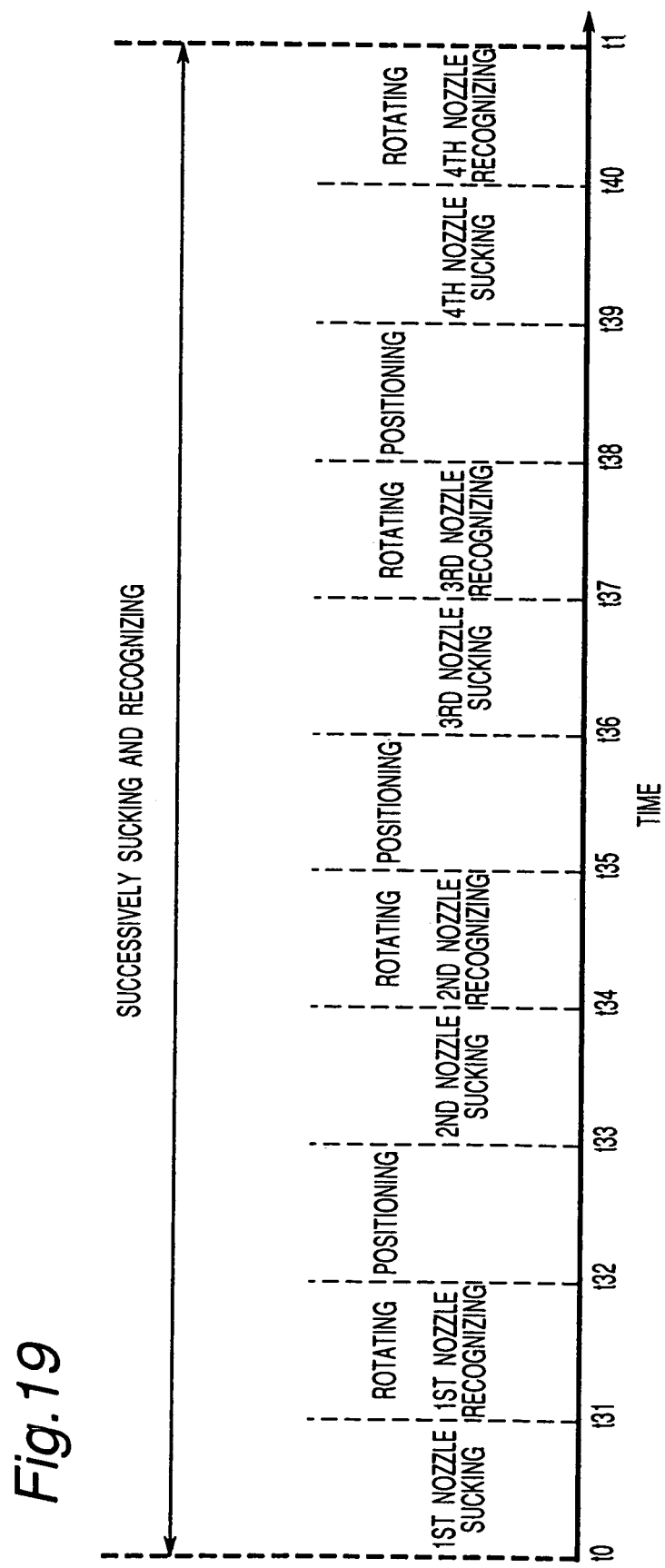
FIG. 19 is a time chart for describing successive sucking and recognizing performed by the apparatus of the third embodiment of the present invention.
Figure 22:
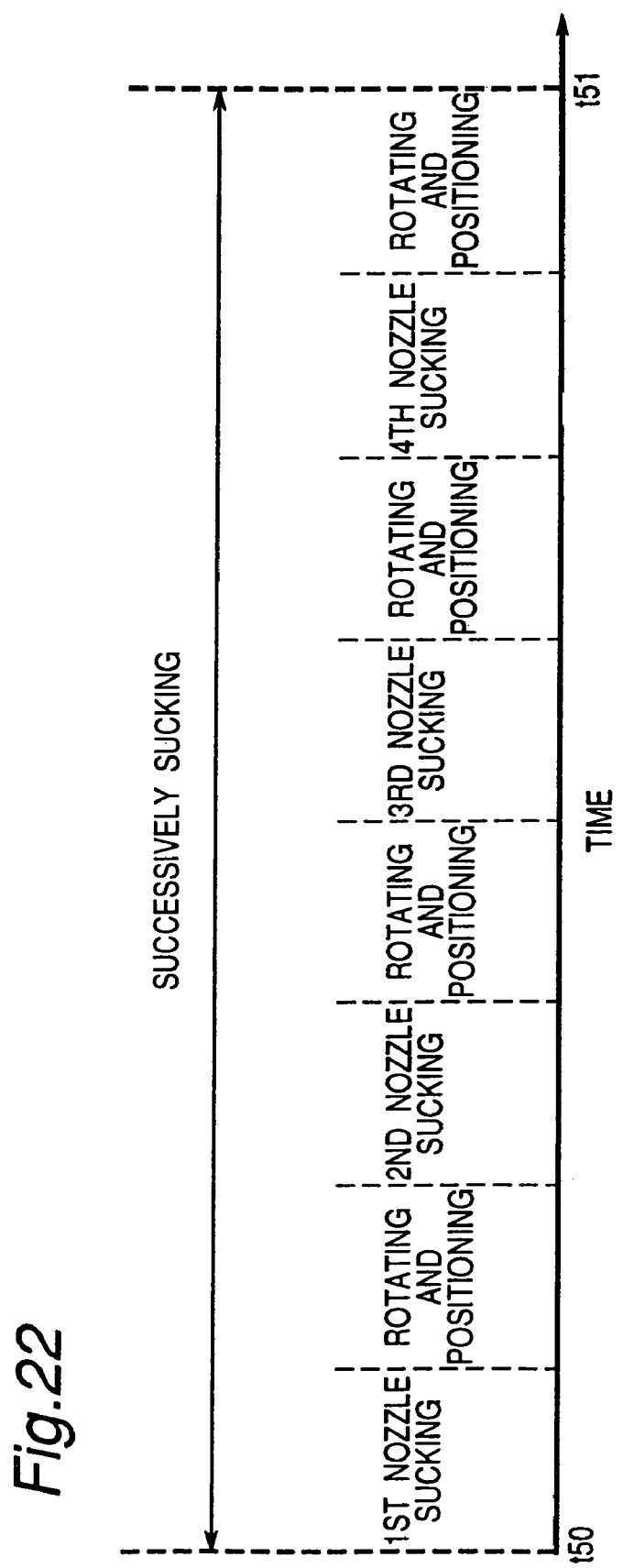
FIG. 22 is a time chart for describing successive sucking performed by the apparatus of the fourth embodiment.

First, as shown in FIG. 20A and a time period from time t0 to time t31 in FIG. 19, the first component suction nozzle 33A is projected by nozzle linear driving motor 69 (refer to FIG. 11), and thereafter sucks component 100 to pick it up from a corresponding component supply table 80. After completion of this suction, the component suction nozzle 33A is moved backward by the nozzle linear driving motor 69.

Next, as shown in FIG. 20B and a time period from t31 to t32 in FIG. 19, rotary member 32 is rotated by an angle of 90 degrees in the clockwise direction in the figures by head rotating motor 63. During this rotation of the rotary member 32, the component 100 that has been sucked to the first component suction 33A is passed across the field of view of the recognition camera 64 and recognized by the recognition camera 64. At the moment when rotation of the rotary member 32 is completed as shown in FIG. 20C, a posture of second component suction nozzle 33B is directed downward in the vertical direction. Further, after completion of rotation of the rotary member 32, the first mounting head section 31A is positioned with respect to one of the component supply devices 12 by head positioning mechanism section 41 (time t32 to t33 in FIG. 19).

Next, as shown in FIG. 20C and during a time period from t33 to t34 in FIG. 19, the second component suction nozzle 33B sucks component 100 to pick it up. After that, as shown in FIG. 20D and during a time period from time t34 to time t35 in FIG. 19, the rotary member 32 is rotated by an angle of 90 degrees in the clockwise direction in the figures. Further, during rotation of the rotary member 32, the component 100 sucked to the second component suction nozzle 33B is passed across the field of view of the recognition camera 64 and recognized by the recognition camera 64. When rotation of the rotary member 32 is completed as shown in FIG. 20E, third component suction nozzle 33C is directed downward in the vertical direction. Further, after completion of rotation of the rotary member 32, the first mounding head section 31A is positioned with respect to the one of the component supply devices 12 (time t35 to time t36 in FIG. 19).

Subsequently, recognition of component 100 sucked to the third component suction nozzle 33C by the recognition camera 64 while the rotary member 32 is rotating (FIG. 20F and time period from time t37 to time t38 in FIG. 19), positioning of the first mounting head section 31A (time period from time t38 to time t39 in FIG. 19), suction of component 100 by fourth component suction nozzle 33D (FIG. 20G and a time period from time t39 to time 40 in FIG. 19), and recognition of the component 100 sucked to the fourth component suction nozzle 33D by the recognition camera 64 (FIG. 20H and a time period from time t40 to time t1) are performed.

Other construction and function of the third embodiment are the same as those of the second embodiment described above. Therefore, the same elements are denoted by the same reference numerals, and description thereof is omitted.

Fourth Embodiment

A fourth embodiment of the present invention will be described below with reference to FIGS. 21 through 24.

In the second and third embodiments described above, the recognition cameras 64 are attached to the frame 61 of the first and second mounting head sections 31A and 31B, and therefore moved together with the component suction nozzles 33A through 33D. In contrast to this, in this fourth embodiment, as schematically shown in FIG. 7, two recognition cameras 64 respectively corresponding to the first and second mounting head sections 31A and 31B are arranged, not on the frame 61, but near the board positioning section 24. Further, field of views of these recognition cameras 64 are directed upward in a vertical direction.

Operation of the component mounting apparatus of the fourth embodiment will be described below.

As shown in FIG. 21, the first mounting head section 31A repeatedly performs successive suction of components 100 at component supply table 80A (time t50 to time t51), moving from the component supply table 80A to above recognition camera 64 (time t51 to t52), successive recognition of the components 100 by the recognition camera 64 (time t52 to time t53), successive adjustment of postures of the components 100 (time t53 to time t54), moving from above the recognition camera 64 to the board positioning section 24 (time t54 to time t55), successive mounting of the components 100 (time t55 to time t59), and moving from the board positioning section 24 to the component supply table 80A (time t59 to time t60). Further, the second mounting head section 31B performs successive mounting of components 100 while the first head section 31A performs the successive suction, recognition, and adjustment (time t50 to time t54). The second mounting head section 31B performs successive suction (time t55 to time t56), successive recognition (time t57 to time t58), and successive adjustment of postures (time t58 to time t59) while the first mounting head section 31A performs the successive mounting of the components 100.

Figure 23:
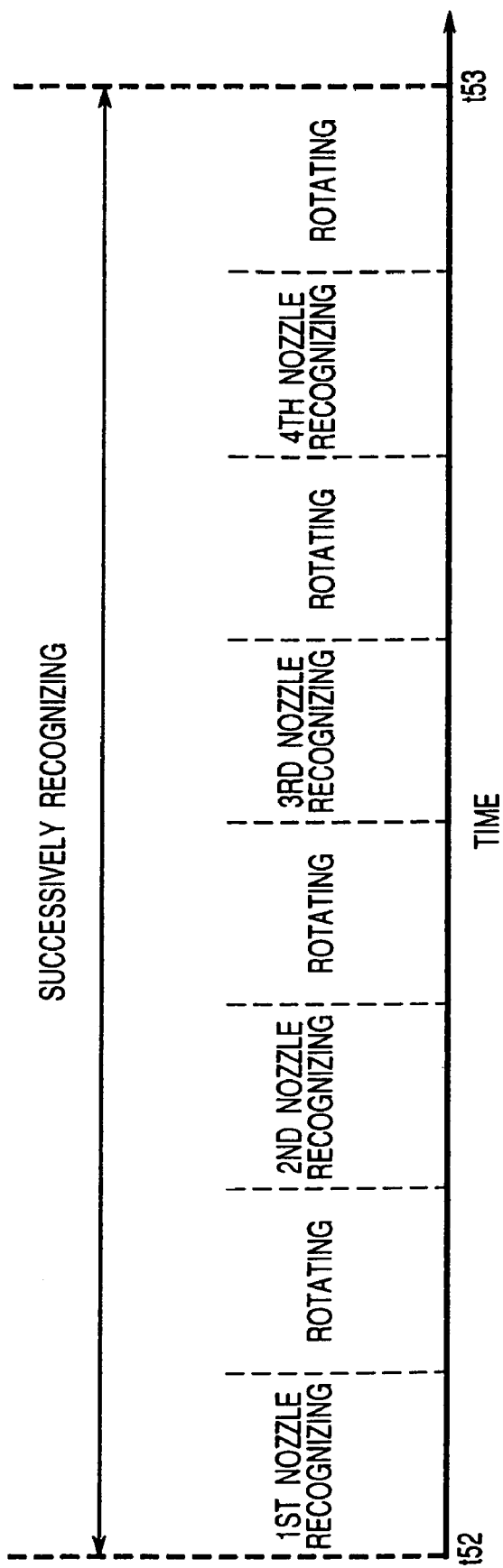
FIG. 23 is a time chart for describing successive recognizing performed by the apparatus of the fourth embodiment.
Figure 24A:
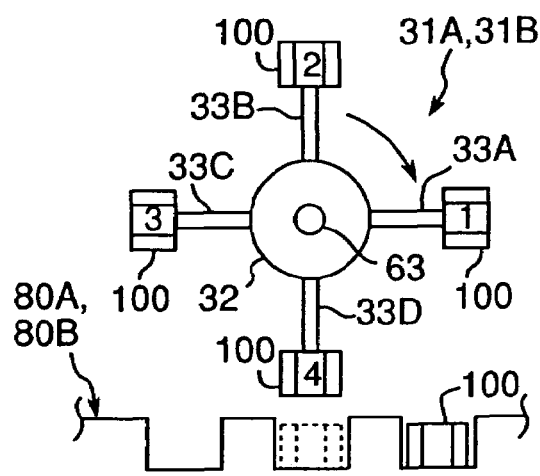
FIGS. 24A through 24D are schematic front views for describing operations of a rotary member and component suction nozzles of the apparatus of the fourth embodiment of the present invention.
Figure 24B:
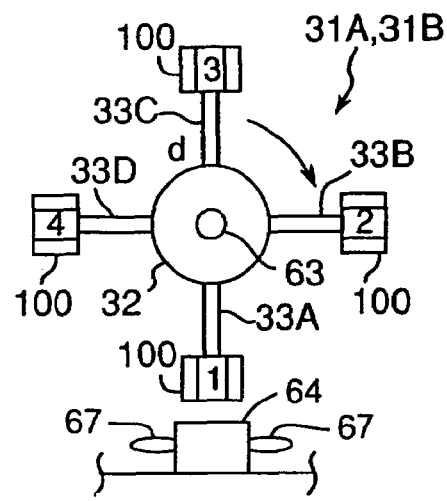
Figure 24C:
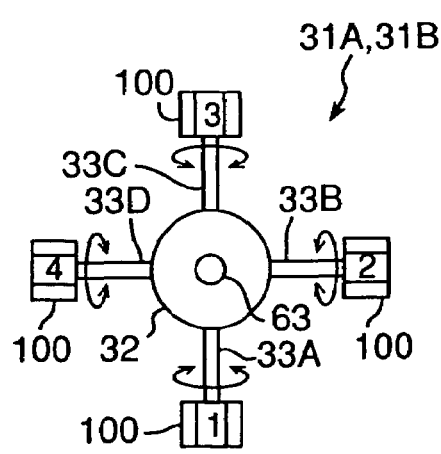

Next, the successive suction, recognition, adjustment, and mounting in the fourth embodiment will be described below taken in conjunction with the first mounting head section 31A. As shown FIGS. 22 and 24A, successive suction is performed by repetition of suction of components 100 by one of the component suction nozzles 33A through 33D, rotation of the rotary member 32, and positioning of the first mounting head section 31A concurrently with rotation of the rotary member 32. As shown in FIGS. 23 and 24B, successive recognition is performed by repetition of recognition of component 100 sucked to one of the component suction nozzles 33A through 33D and rotation of the rotary member 32. As shown in FIG. 24C, successive adjustments of postures of the components 100 is performed by rotating the component suction nozzles 33A through 33D around axes thereof according to recognition results of the recognition camera 64.

Figure 24D:
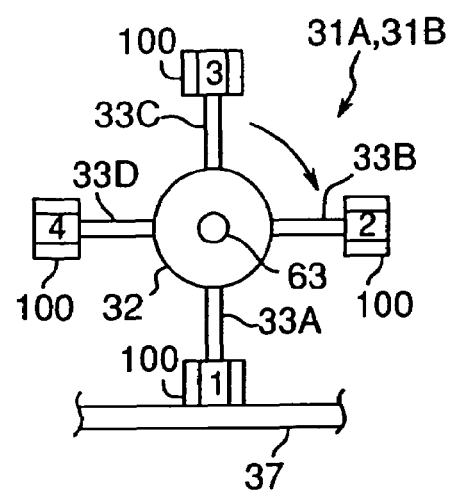

As shown in FIGS. 24D and 14, successive mounting of the components 100 is performed by repetition of the mounting of the component 100 sucked to one of the component suction nozzles 33A through 33D onto circuit board 37, rotation of the rotary member 32, and positioning of the first mounting head section 31A.

Other construction and function of the fourth embodiment are the same as those of the first embodiment described above. Therefore, the same elements are denoted by the same reference numerals, and description thereof is omitted.

Figure 25:
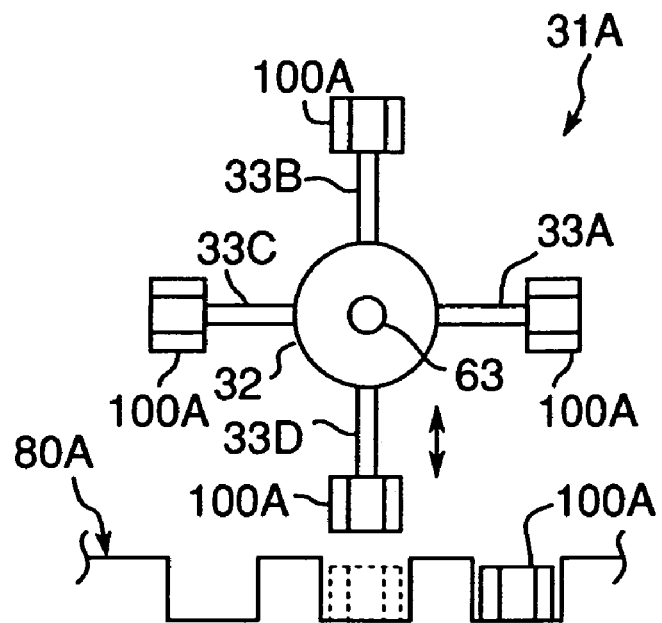
FIG. 25 is a schematic front view showing a mounting head section designed specifically for small components.
Figure 26:
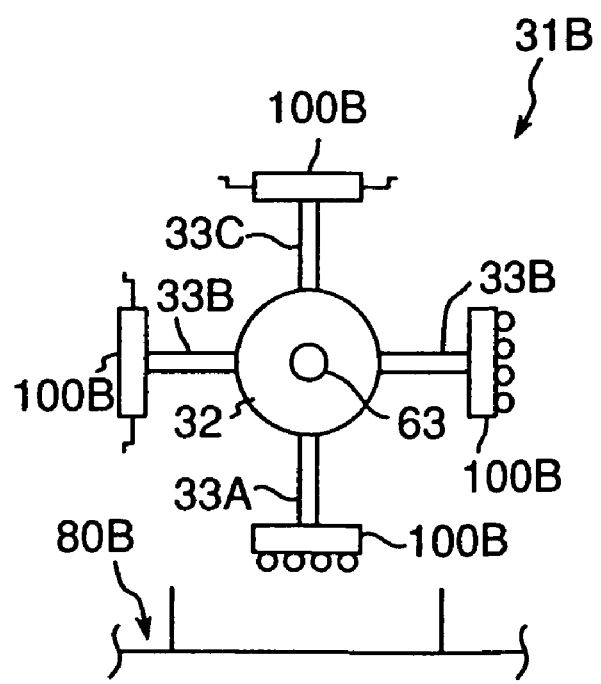
FIG. 26 is a schematic front view showing a mounting head section designed specifically for large components.
Figure 27A:
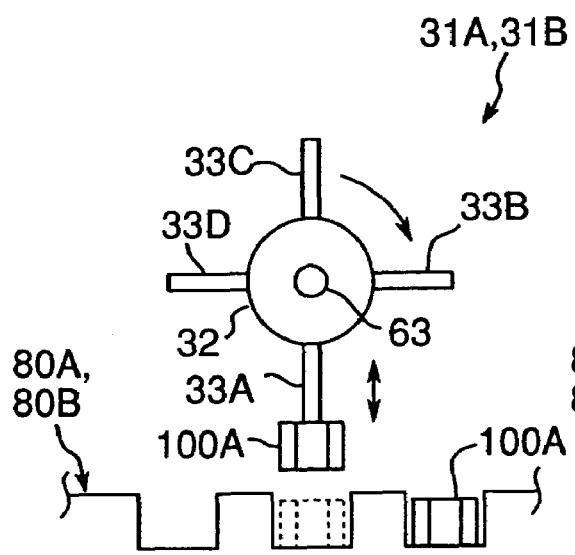
FIGS. 27A through 27D are schematic views for describing a preferable order of sucking to pick-up where one mounting head section sucks a plurality of types of components.
Figure 27B:
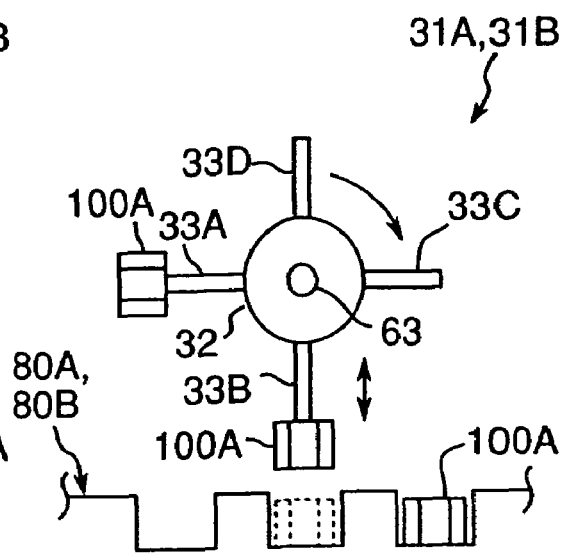
Figure 27C:
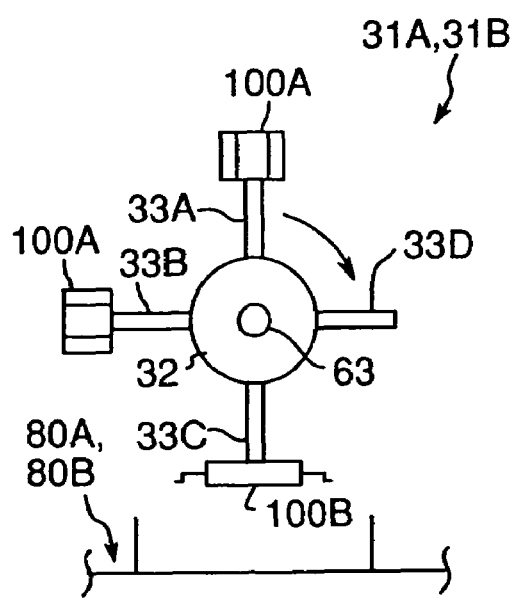
Figure 27D:
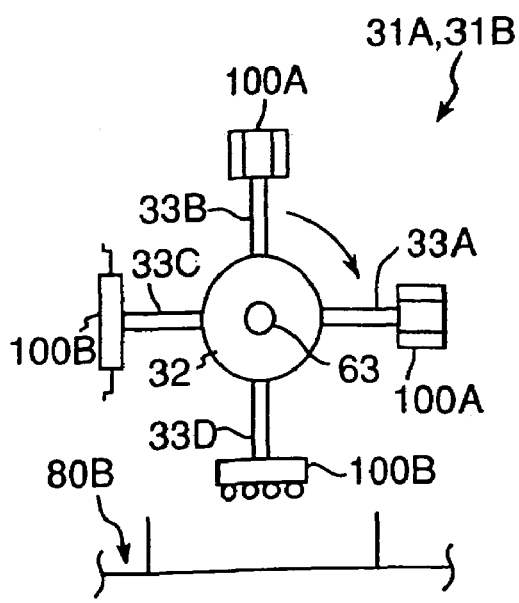
Figure 28A:
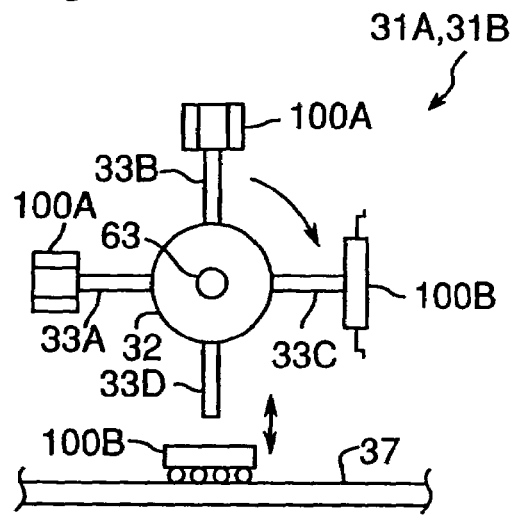
FIGS. 28A through 28D are schematic front views for describing a preferable order of mounting where one mounting head section mounts a plurality of types of components.
Figure 28B:
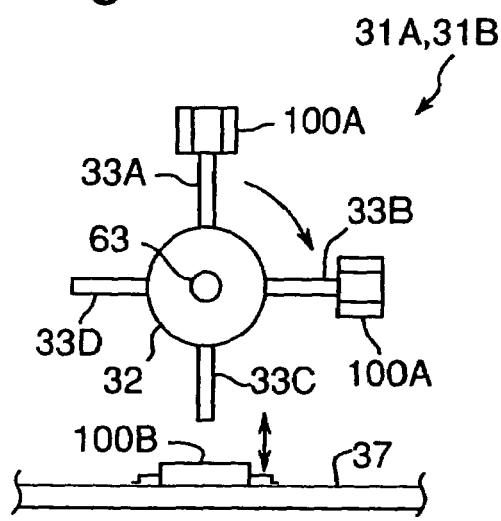
Figure 28C:
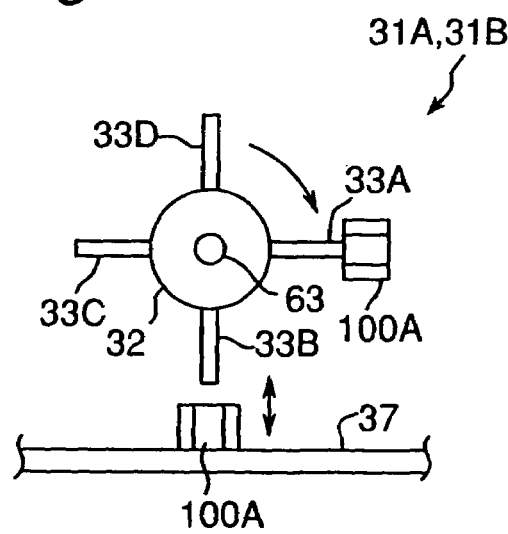
Figure 28D:
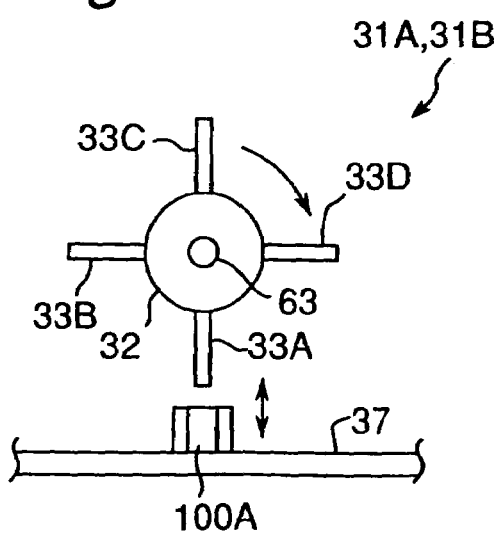

One of the first and second mounting head sections (e.g. the first mounting head section 31A) may be designed specifically for components 10A as shown in FIG. 25 that are smaller in size and can be mounted at high speed, whereas the other of the first and second mounting head sections (the second mounting head section 31B) may be designed for components 100B as shown in FIG. 26 that are larger in size and require a high degree of precision in mounting thereof.

In case that different types of components, namely both of relatively small and large components, are sucked and mounted by the same one of mounting head sections 31A and 31B, it is preferable that suction and mounting of these components are performed in accordance with the following order. First, during successive suction of these different types of components, as shown in FIGS. 27A through 27D, it is preferable that the smaller components 100A are sucked in advance, and thereafter the larger components 100B are sucked. This is because if the larger components 100B are sucked in advance, then an inertial force acting on the rotary member 32 is increased resulting in that reduction in accuracy of an angular position of the rotary member 32 generates an error in positions of the component suction nozzles 33A through 33D. Contrary to this, during successive mounting of the different types of components, as shown in FIGS. 28A through 28D, it is preferable that the larger components 100B are mounted in advance and thereafter the smaller components 100A are mounted. This is because precedent mounting of the larger components 100B decreases an inertial force acting on the rotary member 32 during subsequent rotation, resulting in that improvement of accuracy of a rotary angular position of the rotary member 32 enhances accuracy in positioning of the component suction nozzles 33A through 33D.

Figure 30A:
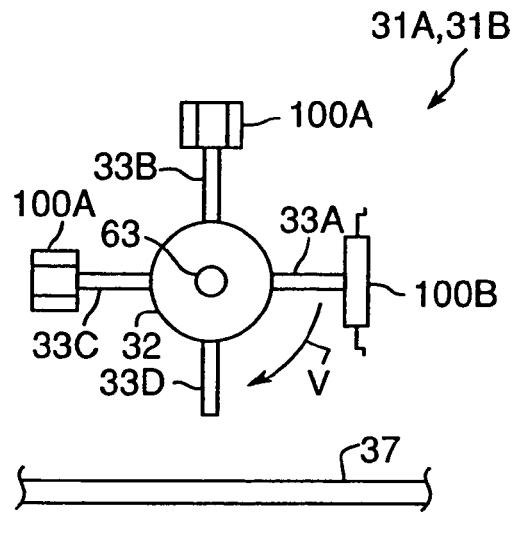
FIGS. 30A through 30D are schematic front views for describing a preferable control for rotational speed of a rotary member.
Figure 30B:
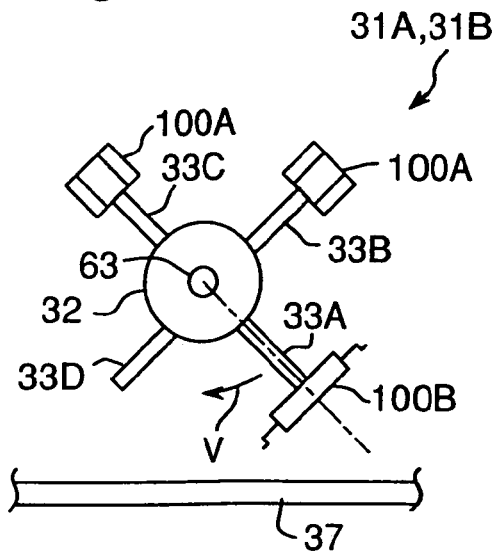
Figure 30C:
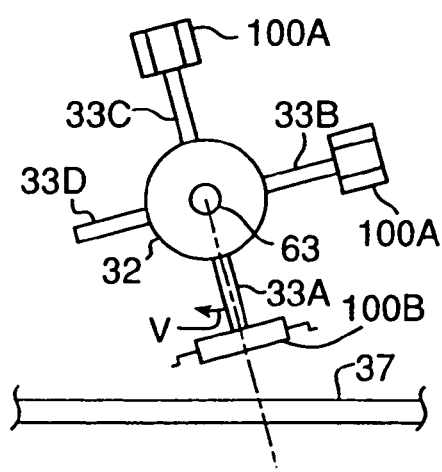
Figure 30D:
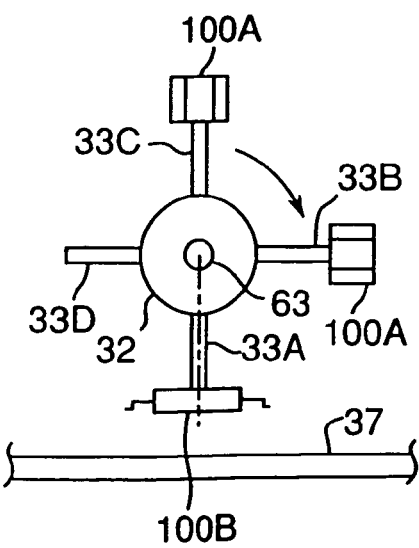
Figure 33:
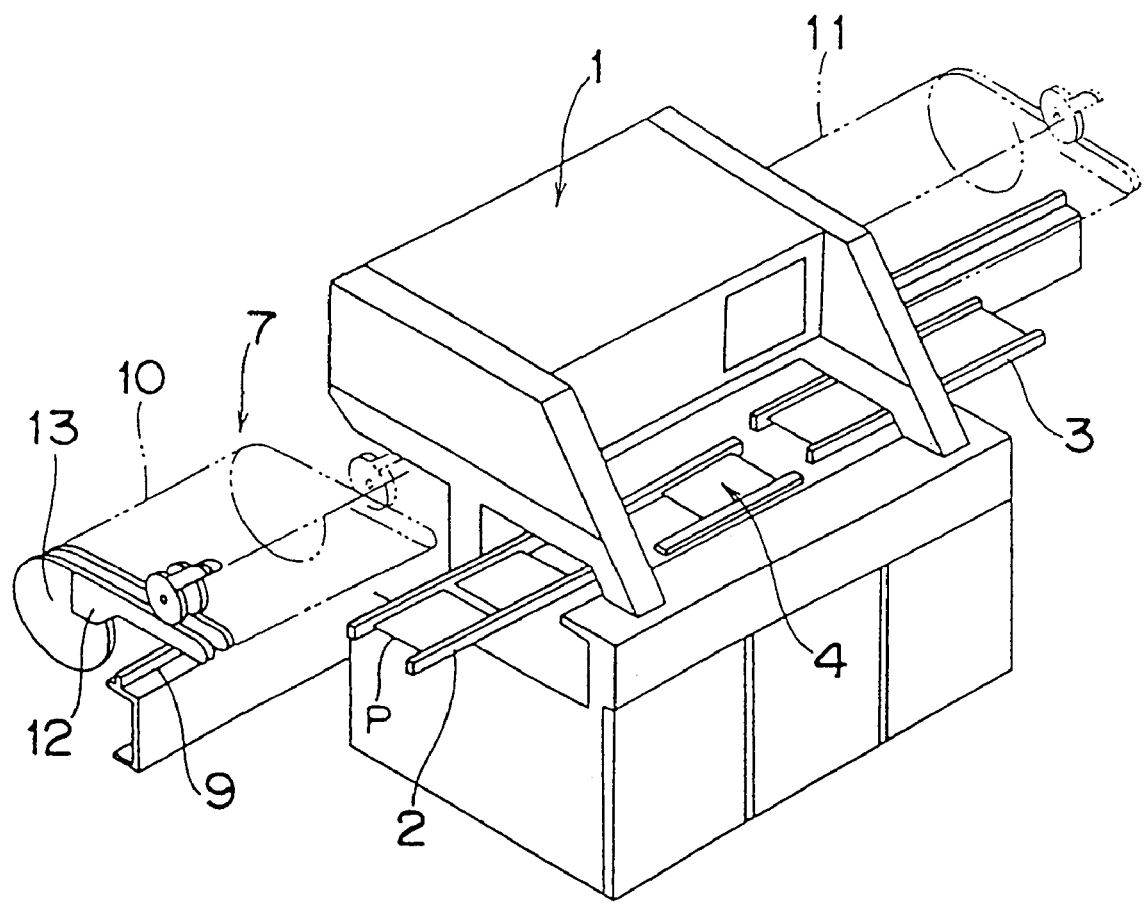
FIG. 33 is a perspective view of a conventional component mounting apparatus.
Figure 34:
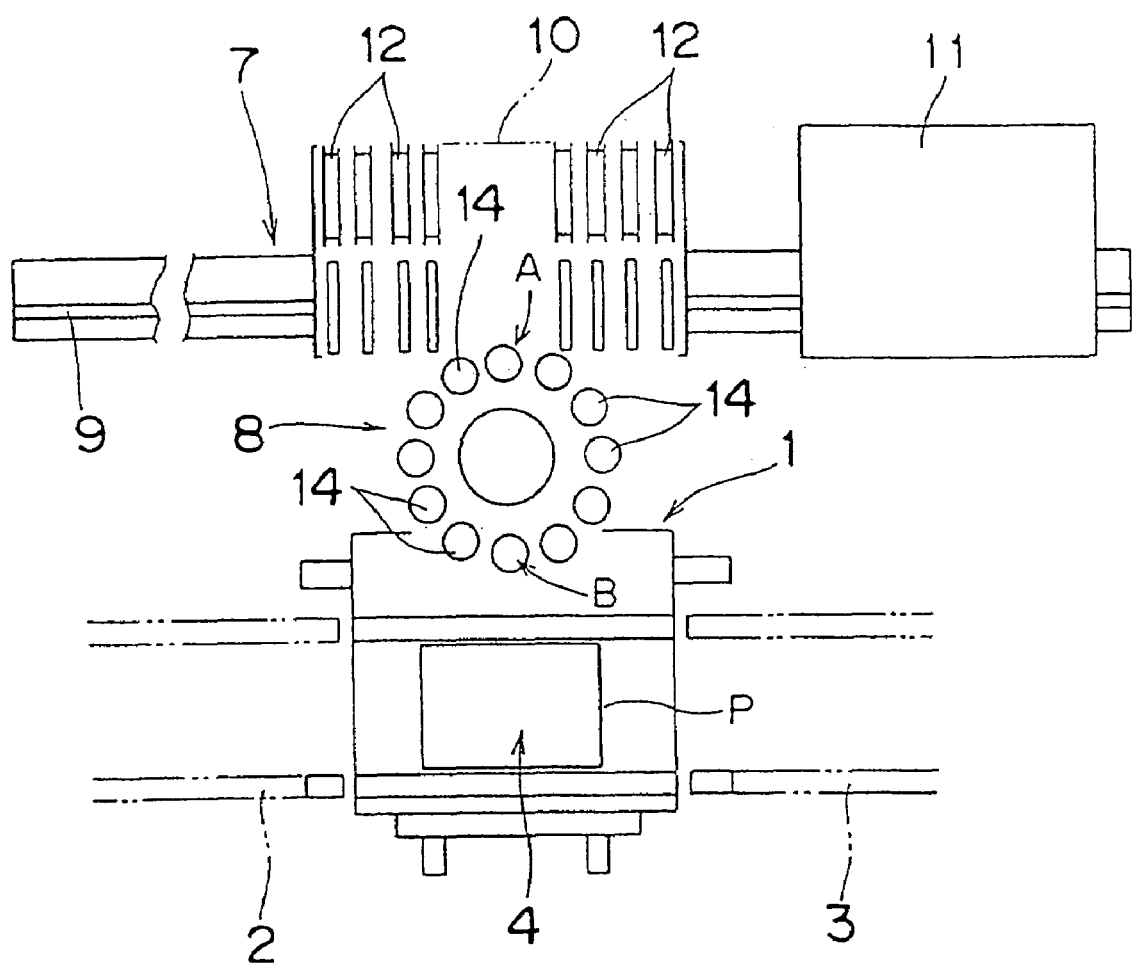
FIG. 34 is a schematic plan view of the above conventional apparatus.

As shown in FIG. 29, if a rotational speed of the rotary member 32 during mounting is high immediately before rotation is stopped, then the rotary member 32 cannot be stopped at a correct rotary angular position due to inertial force, resulting in that the component 100 sucked to the component suction nozzle 33A cannot positioned correctly with respect to the circuit board 37. Therefore, as shown in FIGS. 30A through 30D, it is preferable to change a rotational speed of the rotary member 32 between when rotation is started and immediately before rotation is stopped. An arrow V indicates rotational speed of the rotary member 32 in these FIGS. 30A through 30D. The longer the length of the arrow V is, the faster the rotational speed of the rotary member 32 is. When rotation of the rotary member 32 is started, a rotational speed thereof is set relatively high as shown in FIG. 30A. On the other hand, as the rotary member 32 approaches near its stop position, the rotational speed thereof is decreased. Such control of the rotational speed of the rotary member 32 enables the rotary member 32 to reliably stop at its correct stop position shown in FIG. 30D, resulting in that components to be mounted are positioned with respect to the circuit board 37 with high accuracy.

In the embodiments described above, both of two mounting head sections 31A and 31B are used for mounting components onto a single circuit board 37. However, either of the mounting head sections 31A and 31B may be used according to a type of circuit board 37. As shown schematically in FIGS. 31A and 31B, of two component supply tables 80A and 80B arranged on opposite sides of board positioning section 24, one is provided with a plurality of component supply devices 12 designed specifically for components to be mounted to one type (first type) of a circuit board, whereas the other is provided with a plurality of component supply devices 12 designed specifically for components to be mounted to another type (second type) of circuit board. Further, the one mounting head section 31A is designed specifically for the first type of the circuit board, whereas the other mounting head section 31B is designed specifically for the second type of the circuit board 37'. Accordingly, the one mounting head section 31A is only actuated when components are to be mounted onto the first type of the circuit board 37, and the other mounting head section 31B is only actuated when components are to be mounted onto the second type of the circuit board 37'.

In case that one of the component supply devices 12 mounted on the one component supply table 80A becomes depleted of components as shown in FIG. 32A, preferable procedures for exchanging component supply device 12 to replenish components are as follows. As shown in FIG. 32B, mounting head section 31A corresponding to the component supply table 80A for which replenishment of components is required is caused to stop suction, recognition, adjustment, and mounting. On the other hand, mounting head section 31B corresponding to component supply table 80B for which replenishment is not required continues to perform suction, recognition, adjustment, and mounting. The component supply table 80A with necessity for replenishment of components is pulled out of support frames 29 (refer to FIG. 6), so that component supply table 80A depleted of components is exchanged for a new one. Thereafter, another component supply table 80A is installed between the support frames 29 to be fixed at a predetermined positioned. Finally, the mounting head section 31A corresponding to component supply table 80A is caused to re-start suction, recognition, adjustment, and mounting. This replenishment of components under a situation where only one of the mounting head sections 31A and 31B is stopped in operation keeps reduction of productivity of the component mounting apparatus due to this replenishment of components to a minimum.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A component mounting method comprising:
    positioning a first mounting head section relative to a component supply section;
    rotating a first rotary member of said first mounting head section about a first horizontal axis, thereby successively sucking components from said component supply section via first component suction nozzles attached to said rotary member;
    simultaneously with the rotation of said first rotary member, using a first recognition section to recognize said components sucked by said first component suction nozzles;
    positioning said first mounting head section relative to a board at a board mounting position; and then
    intermittently rotating said first rotary member about said first horizontal axis, thereby successively mounting onto said board said components sucked by said first component suction nozzles; said method further comprising:
    prior to successively mounting to said board said components sucked by said first component suction nozzles, successively rotating said first component suction nozzles about respective first axes, respectively, in accordance with recognition results from said first recognition section, thereby successively adjusting postures of said components sucked by said first component suction nozzles; and
    when said component supply section needs to be replenished with components, replenishing said component supply section with components while
        (i) positioning a second mounting head section relative to another component supply section,
        (ii) rotating a second rotary member of said second head section about a second horizontal axis, thereby successively sucking components from said another component supply section via second component suction nozzles attached to said second rotary member,
        (iii) simultaneously with the rotation of said second rotary member, using a second recognition section to recognize said components sucked by said second component suction nozzles,
        (iv) successively rotating said second component suction nozzles about respective second axes, respectively, in accordance with recognition results from said second recognition section, thereby successively adjusting postures of said components sucked by said second component suction nozzles,
        (v) positioning said second mounting head section relative to said board at said board mounting position, and then
        (vi) intermittently rotating said second rotary member about said second horizontal axis, thereby successively mounting onto said board said components sucked by said second component suction nozzles.

2. The method according to claim 1, further comprising:
after replenishing said component supply section with components
    (i) positioning said first mounting head section relative to said component supply section,
    (ii) rotating said first rotary member about said first horizontal axis, thereby successively sucking components from said component supply section via said first component suction nozzles,
    (iii) simultaneously with the rotation of said first rotary member, using said first recognition section to recognize said components sucked by said first component suction nozzles,
    (iv) successively rotating said first component suction nozzles about said respective first axes, respectively, in accordance with recognition results from said first recognition section, thereby successively adjusting postures of said components sucked by said first component suction nozzles,
    (v) positioning said first mounting head section relative to a board at said board mounting position, and then
    (vi) intermittently rotating said first rotary member about said first horizontal axis, thereby successively mounting onto said board said components sucked by said first component suction nozzles.

3. The method according to claim 1, wherein
successively mounting onto said board said components sucked by said first component suction nozzles comprises mounting all of said components onto said board before another component is picked up by any of said first component suction nozzles, and before another component is recognized by said first recognition section.

4. A component mounting method comprising:
positioning a first mounting head section relative to a component supply section;
rotating a first rotary member of said first mounting head section about a first horizontal axis, thereby successively sucking components from said component supply section via first component suction nozzles attached to said rotary member; then
using a first recognition section to recognize said components sucked by said first component suction nozzles;
positioning said first mounting head section relative to a board at a board mounting position; and then
intermittently rotating said first rotary member about said first horizontal axis, thereby successively mounting onto said board said components sucked by said first component suction nozzles; said further method comprising:

prior to successively mounting to said board said components sucked by said first component suction nozzles, successively rotating said first component suction nozzles about respective first axes, respectively, in accordance with recognition results from said first recognition section, thereby successively adjusting postures of said components sucked by said first component suction nozzles; and when said component supply section needs to be replenished with components, replenishing said component supply section with components while
  (i) positioning a second mounting head section relative to another component supply section,
  (ii) rotating a second rotary member of said second head section about a second horizontal axis, thereby successively sucking components from said another component supply section via second component suction nozzles attached to said second rotary member, then
  (iii) using a second recognition section to recognize said components sucked by said second component suction nozzles,
  (iv) successively rotating said second component suction nozzles about respective second axes, respectively, in accordance with recognition results from said second recognition section, thereby successively adjusting postures of said components sucked by said second component suction nozzles,
  (v) positioning said second mounting head section relative to said board at said board mounting position, and then
  (vi) intermittently rotating said second rotary member about said second horizontal axis, thereby successively mounting onto said board said components sucked by said second component suction nozzles.

5. The method according to claim 4, further comprising:

after replenishing said component supply section with components
  (i) positioning said first mounting head section relative to said component supply section,
  (ii) rotating said first rotary member about said first horizontal axis, thereby successively sucking components from said component supply section via said first component suction nozzles, then
  (iii) using said first recognition section to recognize said components sucked by said first component suction nozzles,
  (iv) successively rotating said first component suction nozzles about said respective first axes, respectively, in accordance with recognition results from said first recognition section, thereby successively adjusting postures of said components sucked by said first component suction nozzles,
  (v) positioning said first mounting head section relative to a board at said board mounting position, and then
  (vi) intermittently rotating said first rotary member about said first horizontal axis, thereby successively mounting onto said board said components sucked by said first component suction nozzles.

6. The method according to claim 4, wherein successively mounting onto said board said components sucked by said first component suction nozzles comprises mounting all of said components onto said board before another component is picked up by any of said first component suction nozzles, and before another component is recognized by said first recognition section.

* * * * *

UNITED STATES PATENT AND TRADEMARK OFFICE
CERTIFICATE OF CORRECTION

PATENT NO. : 7,356,919 B2 Page 1 of 1
APPLICATION NO. : 11/429063
DATED : April 15, 2008
INVENTOR(S) : Kanji Hata et al.

It is certified that error appears in the above-identified patent and that said Letters Patent is hereby corrected as shown below:

On the Title Page, Item (60), line 6, change "Nov. 15, 1996" to --Nov. 5, 1996--.

Signed and Sealed this

Second Day of September, 2008

JON W. DUDAS
*Director of the United States Patent and Trademark Office*